(12) United States Patent
Yen et al.

(10) Patent No.: US 7,846,756 B2
(45) Date of Patent: Dec. 7, 2010

(54) NANOIMPRINT ENHANCED RESIST SPACER PATTERNING METHOD

(75) Inventors: Bing K. Yen, Cupertino, CA (US);
Chun-Ming Wang, Fremont, CA (US);
Yung-Tin Chen, Santa Clara, CA (US);
Steven Maxwell, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 73 days.

(21) Appl. No.: 12/318,590

(22) Filed: Dec. 31, 2008

(65) Prior Publication Data

US 2010/0167502 A1    Jul. 1, 2010

(51) Int. Cl.
*H01L 21/00* (2006.01)

(52) U.S. Cl. .................. 438/42; 438/39; 438/696; 438/699; 438/702; 438/703

(58) Field of Classification Search .............. 438/42
See application file for complete search history.

(56) References Cited

U.S. PATENT DOCUMENTS

| | | | |
|---|---|---|---|
| 5,915,167 A | 6/1999 | Leedy | |
| 5,977,638 A | 11/1999 | Rodgers et al. | |
| 6,055,180 A | 4/2000 | Gudesen et al. | |
| 6,420,231 B1 | 7/2002 | Harari et al. | |
| 6,853,049 B2 | 2/2005 | Herner | |
| 6,946,719 B2 | 9/2005 | Petti et al. | |
| 6,952,030 B2 | 10/2005 | Herner et al. | |
| 7,081,377 B2 | 7/2006 | Cleeves | |
| 7,176,064 B2 | 2/2007 | Herner | |
| 7,211,866 B2 | 5/2007 | Yuan et al | |
| 2004/0245557 A1 | 12/2004 | Seo et al. | |
| 2005/0052915 A1 | 3/2005 | Herner et al. | |
| 2005/0226067 A1 | 10/2005 | Herner et al. | |
| 2006/0250836 A1 | 11/2006 | Herner et al. | |
| 2006/0250837 A1 | 11/2006 | Herner et al. | |
| 2006/0273298 A1 | 12/2006 | Petti | |
| 2007/0072360 A1 | 3/2007 | Kumar et al. | |
| 2007/0114509 A1 | 5/2007 | Herner | |
| 2007/0164309 A1 | 7/2007 | Kumar et al. | |
| 2008/0013364 A1 | 1/2008 | Kumar et al. | |
| 2009/0239382 A1* | 9/2009 | Zhu | ............... 438/696 |

OTHER PUBLICATIONS

U.S. Appl. No. 09/560,626, filed Apr. 28, 2000, Knall.

(Continued)

*Primary Examiner*—Thanh V Pham
*Assistant Examiner*—Tony Tran
(74) *Attorney, Agent, or Firm*—The Marbury Law Group PLLC

(57) ABSTRACT

A method of making a device is disclosed including: forming a first hard mask layer over an underlying layer; forming a first imprint resist layer over the underlying layer; forming first features over the first hard mask layer by bringing a first imprint template in contact with the first imprint resist layer; forming a first spacer layer over the first features; etching the first spacer layer to form a first spacer pattern and to expose top of the first features; removing the first features; patterning the first hard mask, using the first spacer pattern as a mask, to form first hard mask features; and etching at least part of the underlying layer using the first hard mask features as a mask.

24 Claims, 30 Drawing Sheets

OTHER PUBLICATIONS

U.S. Appl. No. 11/864,205, filed Sep. 28, 2007, Yung-Tin Chen et al.
U.S. Appl. No. 11/864,532, filed Sep. 28, 2007, Maxwell.
U.S. Appl. No. 12/000,758, filed Dec. 17, 2007, Petti et al.
U.S. Appl. No. 12/007,780, filed Jan. 15, 2008, Herner et al.
U.S. Appl. No. 12/007,781, filed Jan. 15, 2008, Dunton et al.
U.S. Appl. No. 12/216,107, filed Jun. 30, 2008, Chan.
U.S. Appl. No. 12/149,151, filed Apr. 28, 2008, Chen et al.
U.S. Appl. No. 12/222,293, filed Aug. 6, 2008, Chan.
U.S. Appl. No. 12/289,396, filed Oct. 27, 2008, Chen et al.
Kim, Ryoung H. et al., "Double Exposure Using 193 nm Negative Tone Photoresist", Optical Microlithography XX, Proc of SPIE, vol. 6520, 65202M, 2007, 8 pgs.

Nakamura, Hiroko et al., "Contact Hole Formation by Multiple Exposure Technique in Ultra-low $k_1$ Lithography", Optical Microlithography XVII, Proceedings of SPIE, vol. 5377, Feb. 24-27, 2004, pp. 255-263.

Nakamura, Hiroko et al., "Low $k_1$ Contact Hole Formation by Double Line and Space Formation Method with Contact Hole Mask and Dipole Illumination", The Japan Society of Applied Physics, vol. 45, No. 6B, 2000, pp. 5409-5417.

U.S. Appl. No. 12/318,609, filed Dec. 31, 2008, Chen et al.

\* cited by examiner

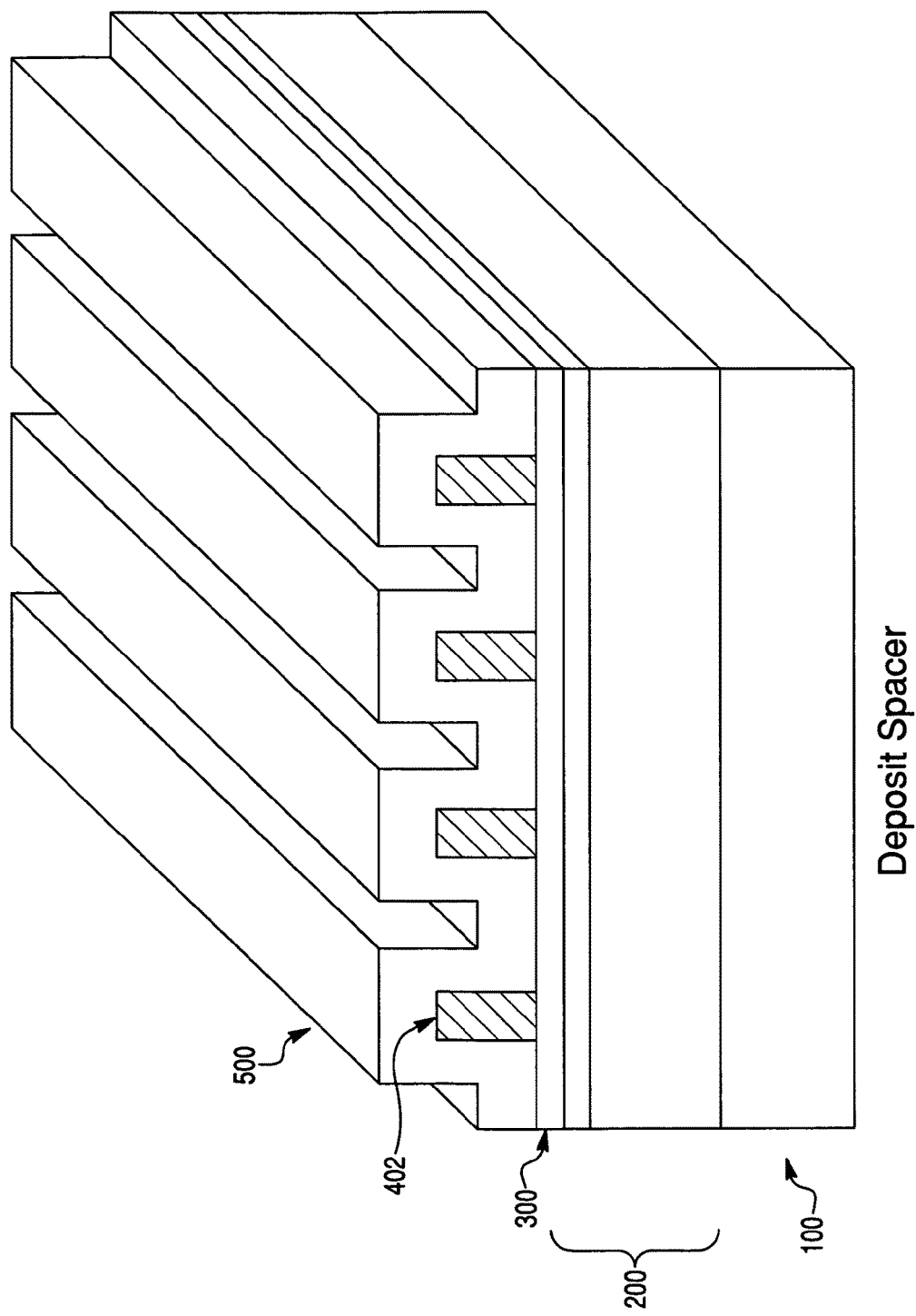

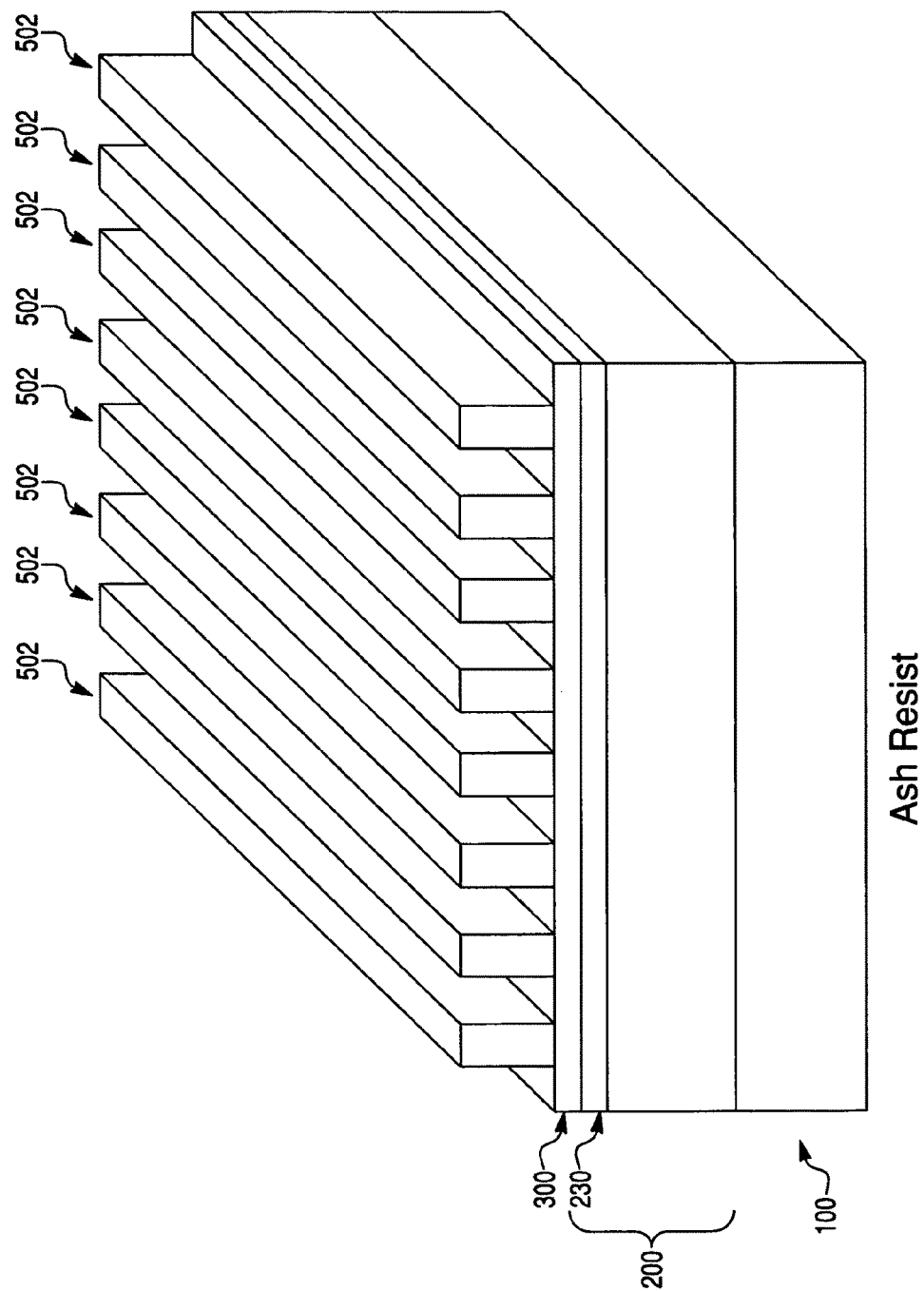

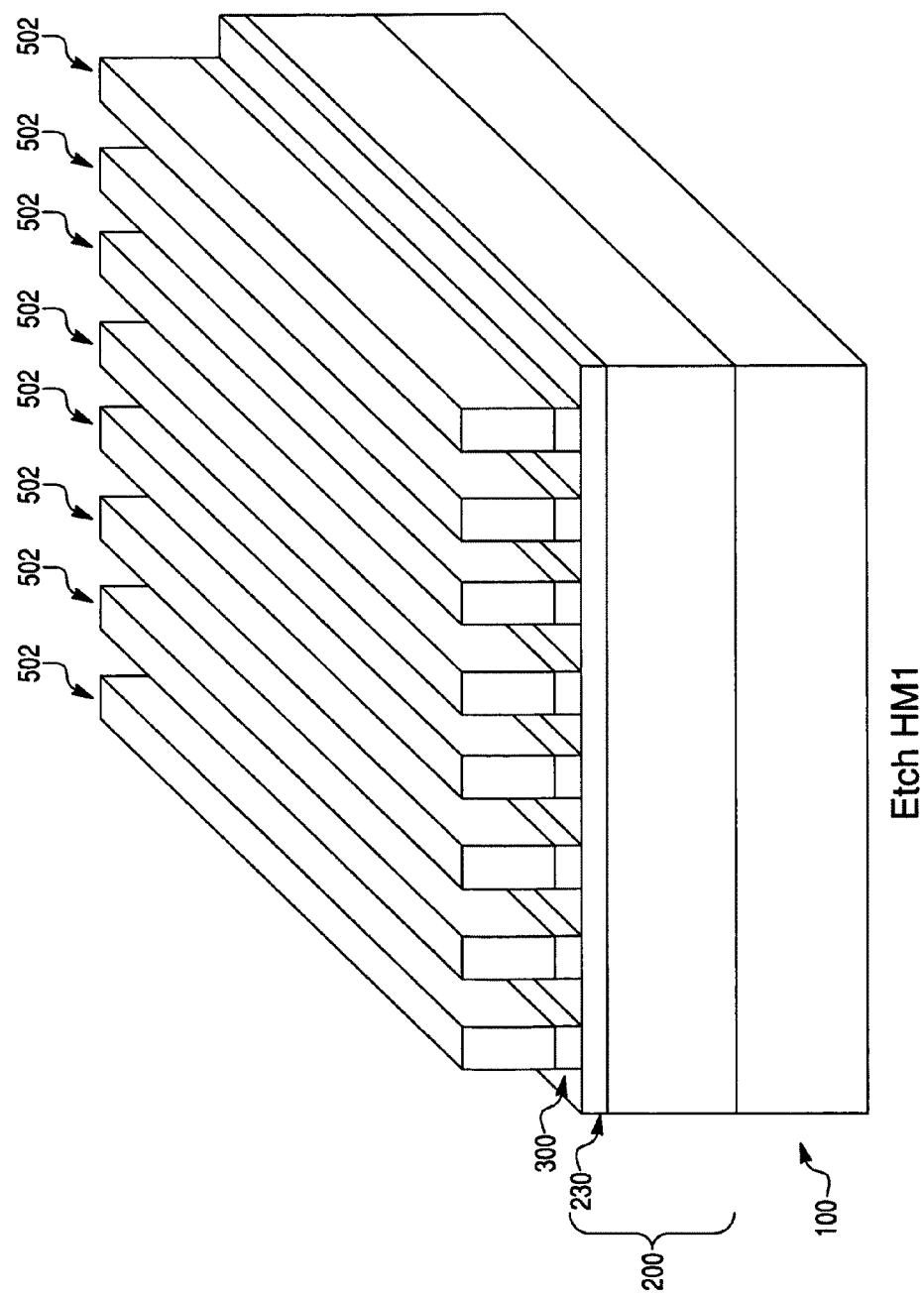

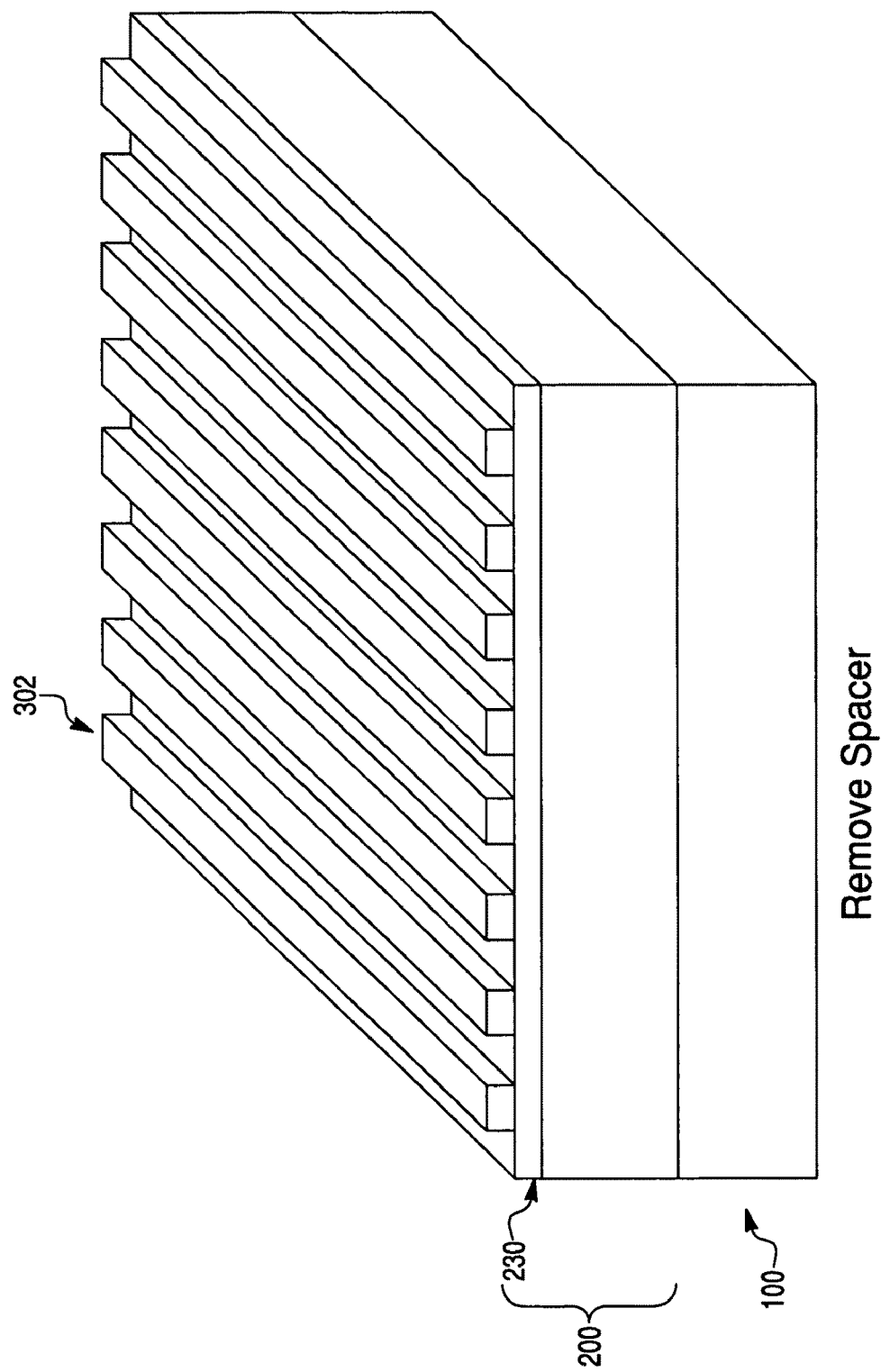

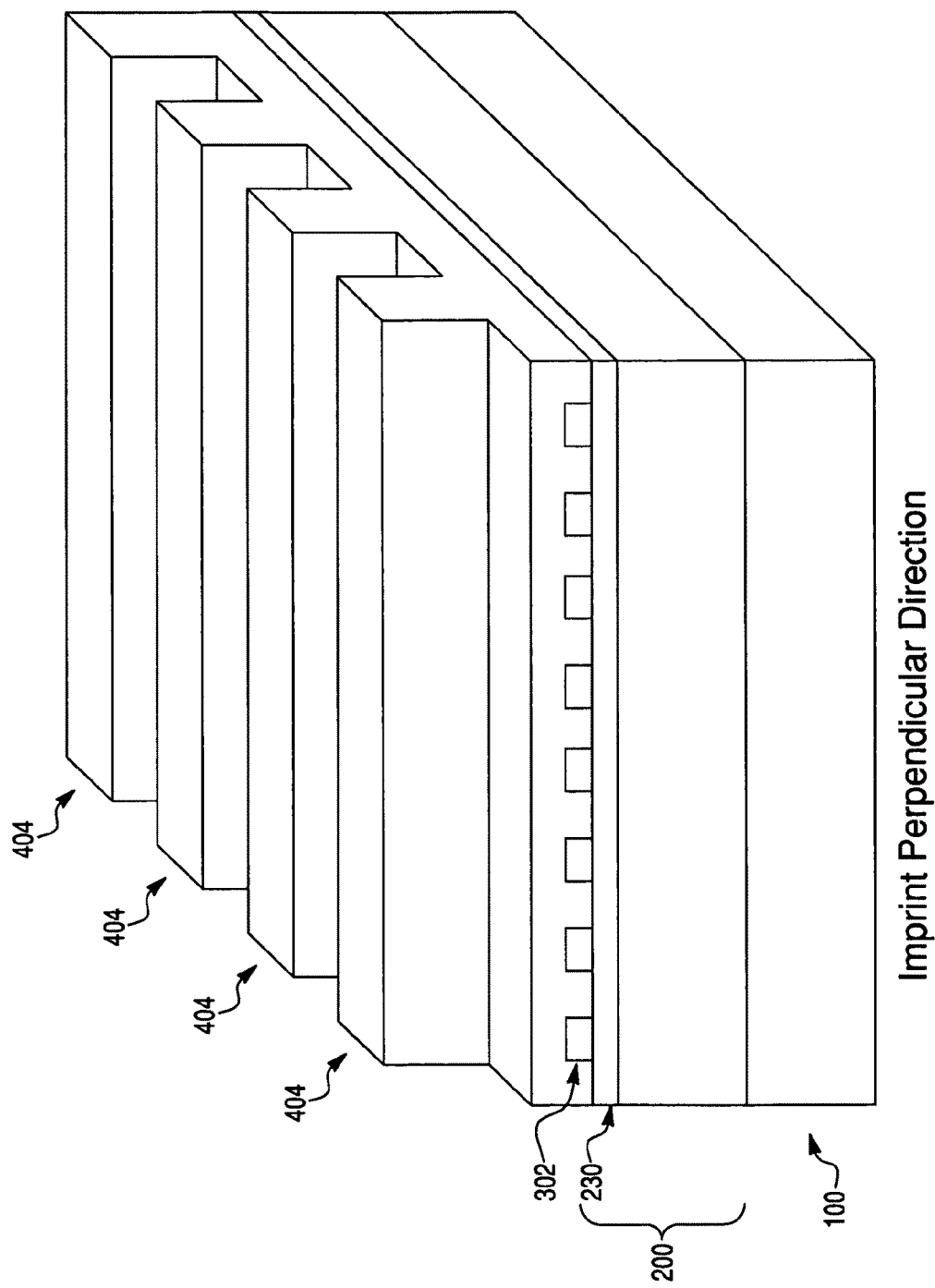

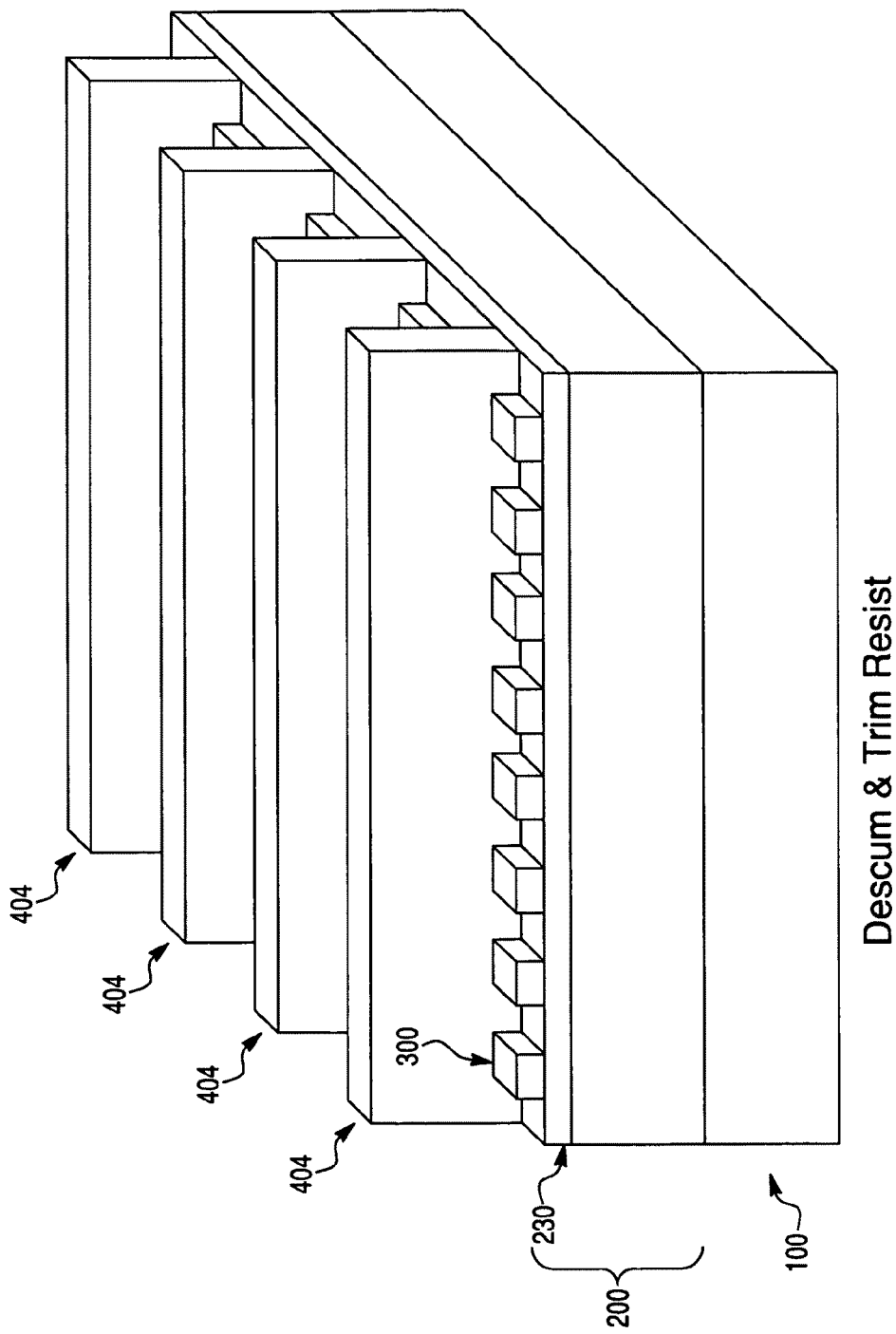

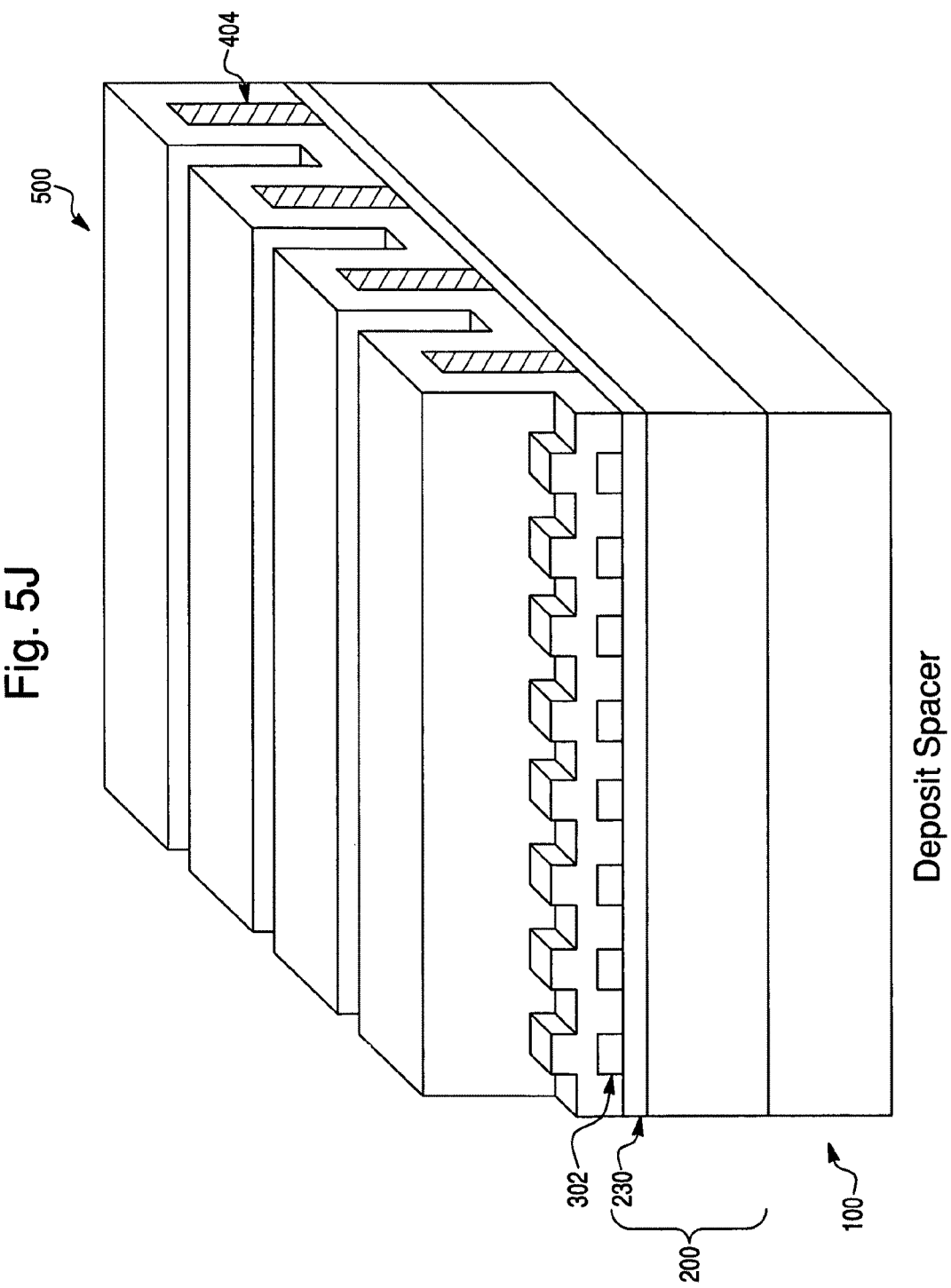

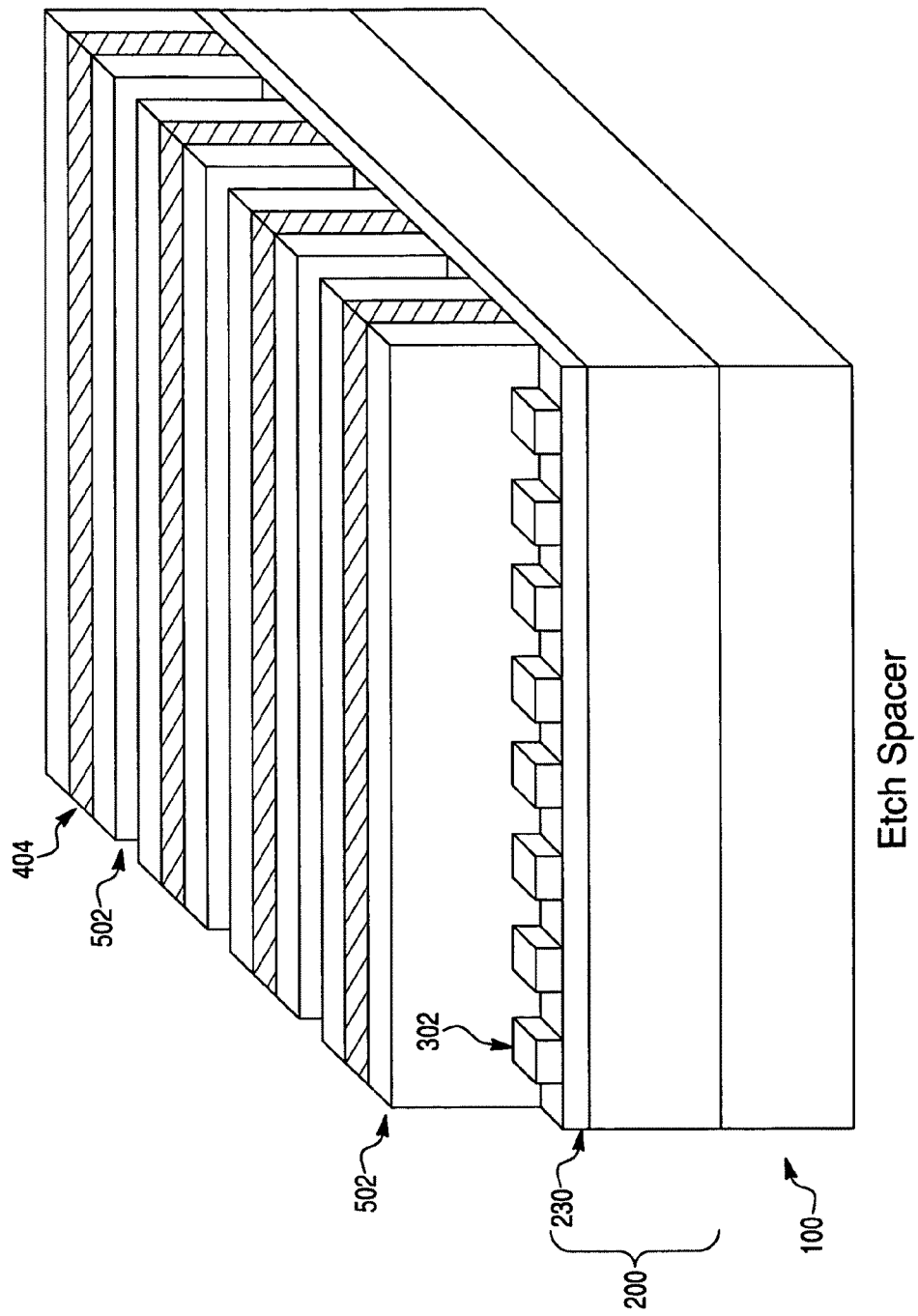

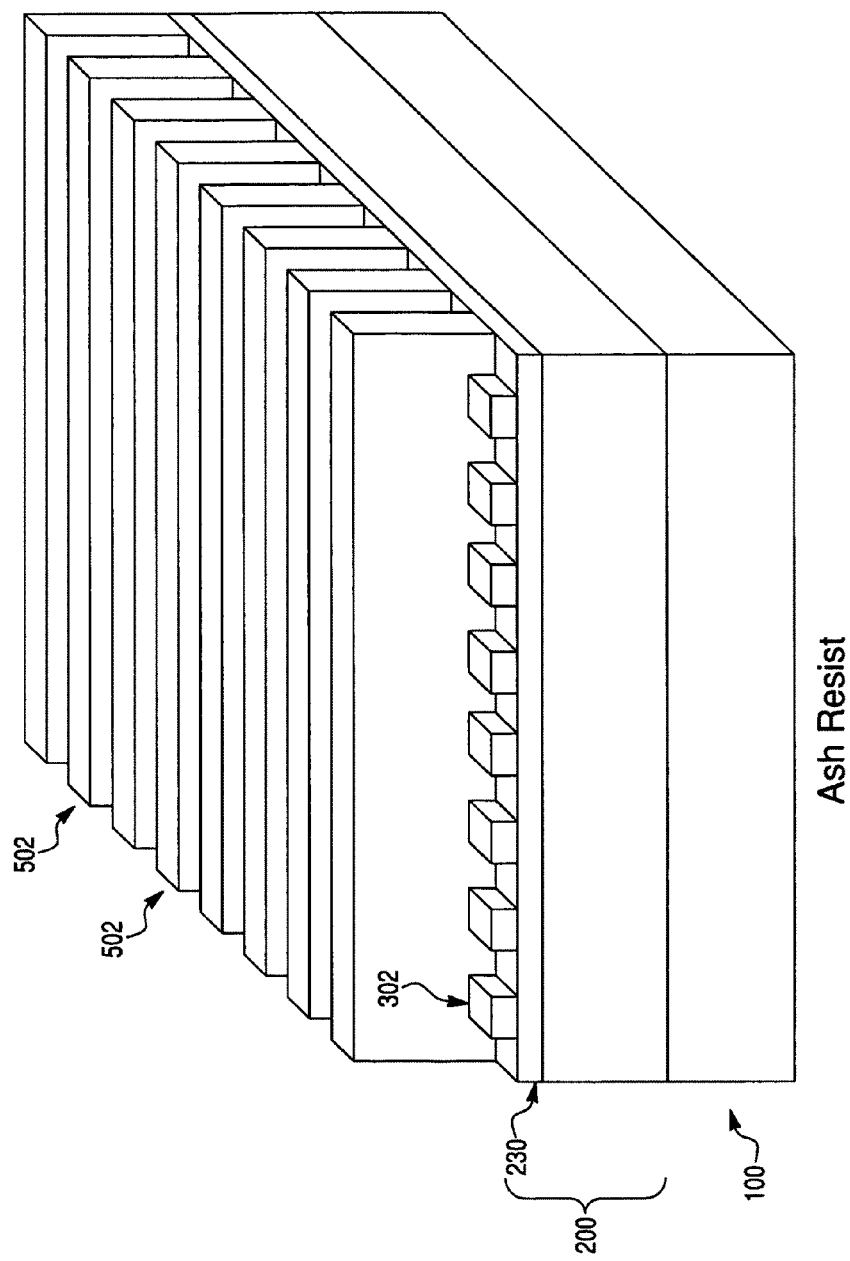

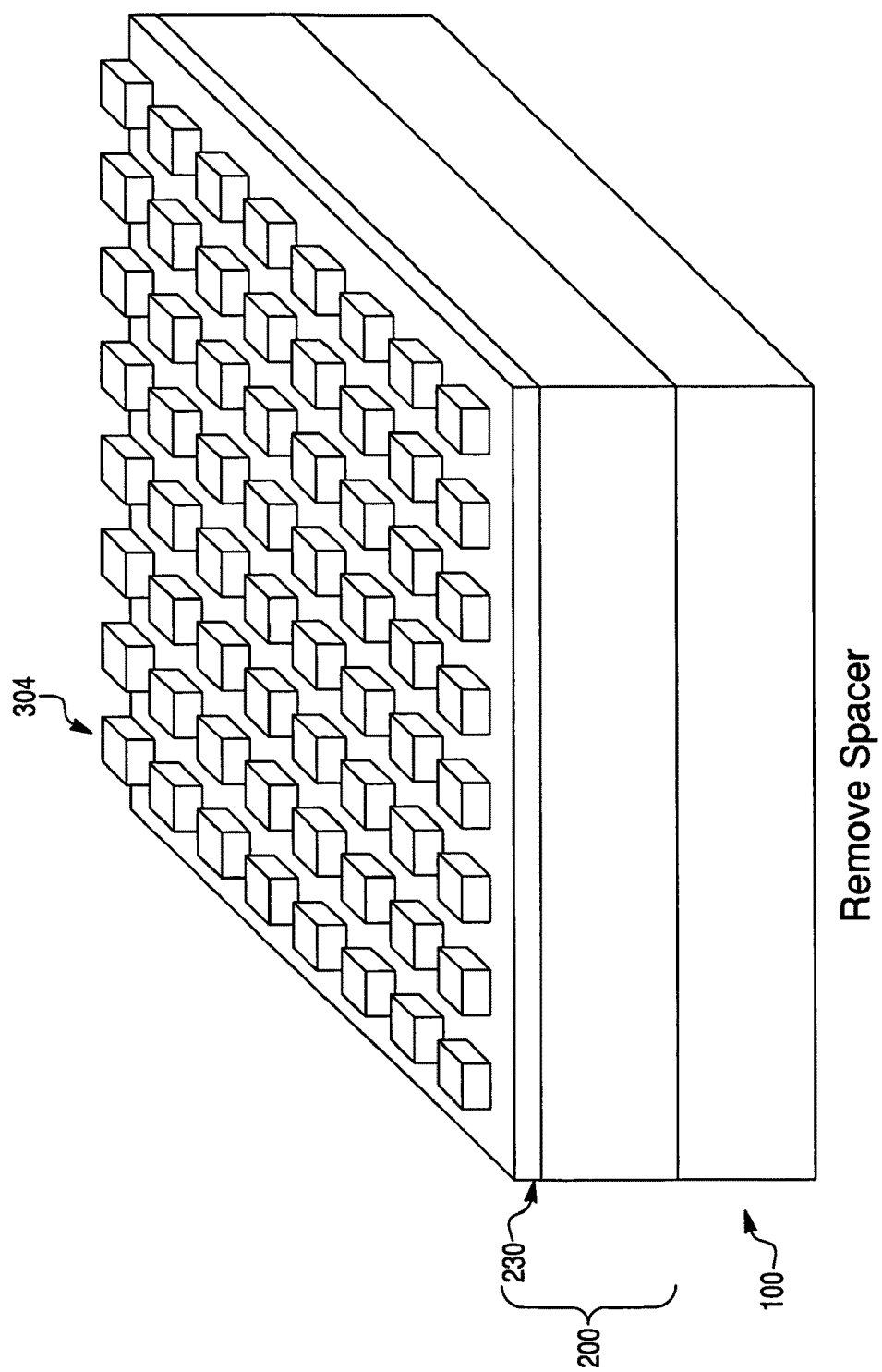

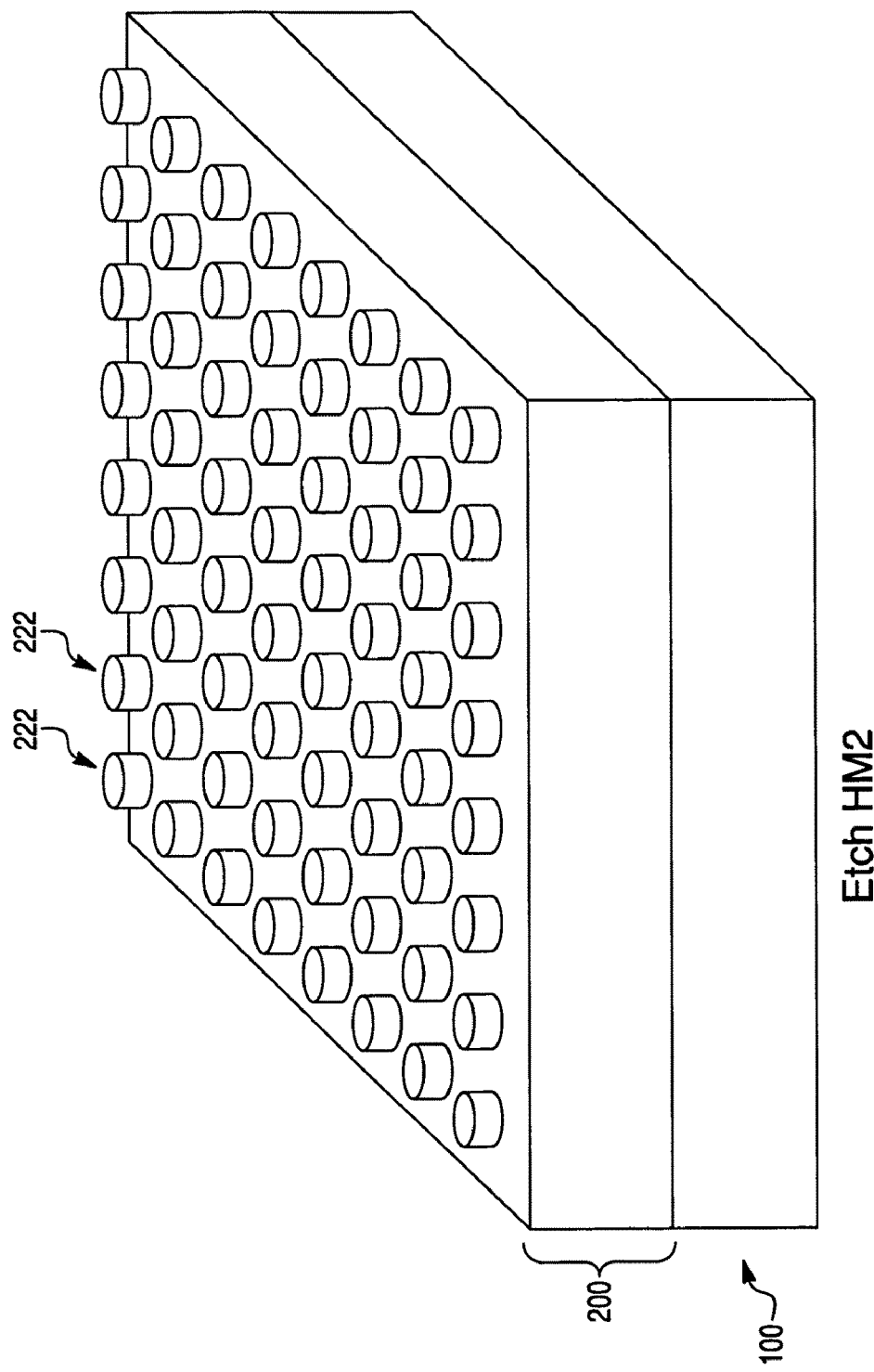

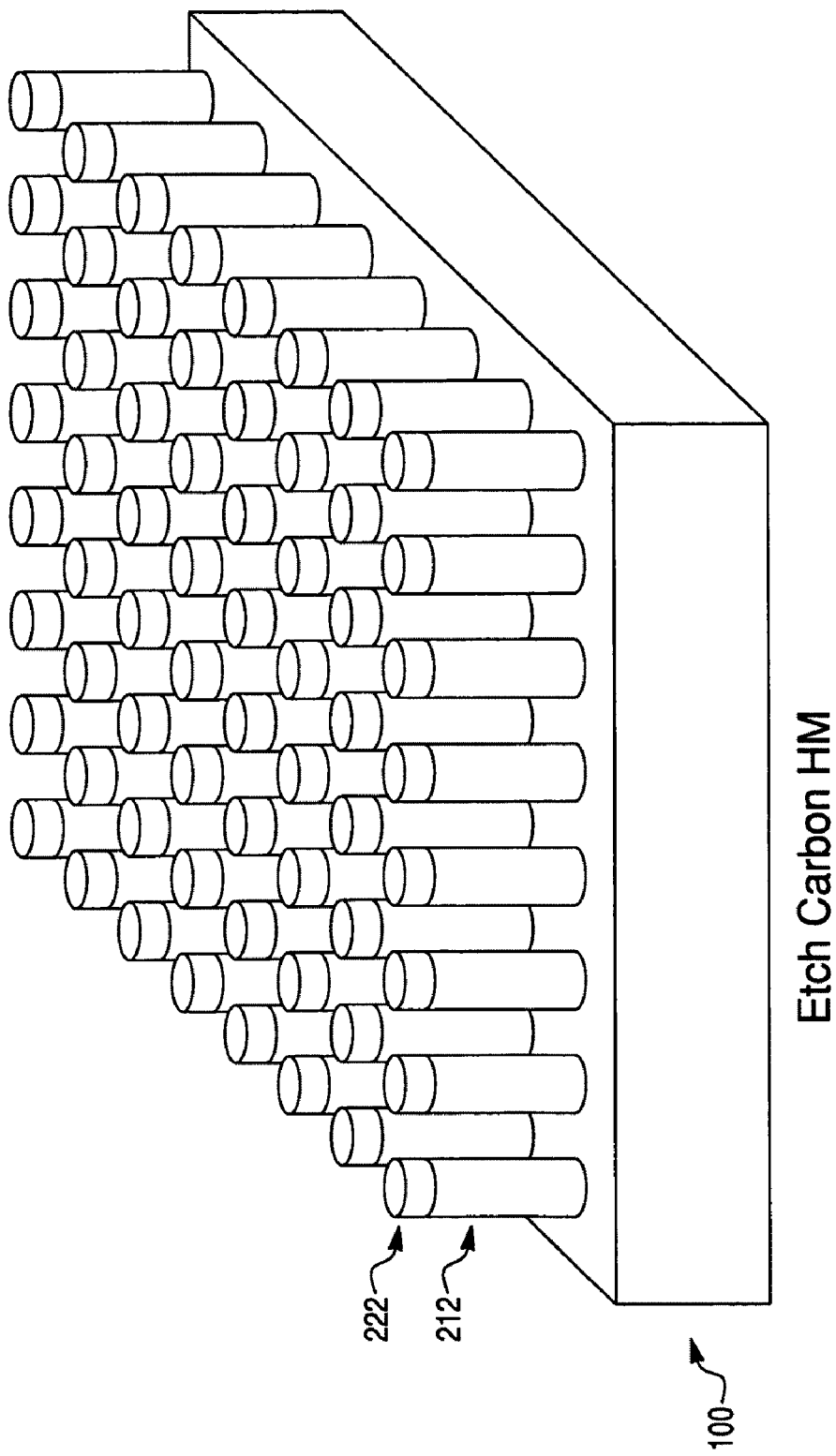

NANOIMPRINT ENHANCED RESIST SPACER PATTERNING METHOD

BACKGROUND OF THE INVENTION

The invention relates generally to a method for making a semiconductor device, for example, a nonvolatile memory array containing a diode.

One prior art process using a hard mask stack shown in FIG. 1A can be used to fabricate 45 nm and 80 nm features. The stack consists of a layer of organic hard mask 103, also known as an amorphous carbon advanced patterning film (APF), a layer of Dielectric Anti-Reflective Coating (DARC) 106, such as silicon oxynitride, on top of organic hard mask 103, and a Bottom Anti-Refection Coating (BARC) 109 layer, such as an organic BARC layer, on top of DARC layer 106. A photoresist 111 can be coated above the BARC layer. A device layer 110 can be etched using at least one or more layers of the stack as a mask.

SUMMARY OF THE EMBODIMENTS

An embodiment of the invention provides method of making a device, comprising forming a first hard mask layer over an underlying layer; forming a first imprint resist layer over the underlying layer; and forming first features over the first hard mask layer by bringing a first imprint template in contact with the first imprint resist layer. The method also comprises forming a first spacer layer over the first features; etching the first spacer layer to form a first spacer pattern and to expose top of the first features; and removing the first features. The method further comprises patterning the first hard mask, using the first spacer pattern as a mask, to form first hard mask features; and etching at least part of the underlying layer using the first hard mask features as a mask. In another embodiment, the method further comprises forming a second imprint resist layer over the first hard mask features; forming second features over the first hard mask features by bringing a second imprint template in contact with the second imprint resist layer; and forming a second spacer layer over the second features. The method further comprises etching the second spacer layer to form a second spacer pattern and to expose top of the second features; removing the second features; etching the first hard mask features, using the second spacer pattern as a mask, to form second hard mask features; and etching at least part of the underlying layer using the second hard mask features as a mask.

DETAILED DESCRIPTION OF THE PREFERRED EMBODIMENTS

One embodiment of the invention provides a method of making a device, including forming a first hard mask layer over an underlying layer, forming first features over the first hard mask layer using nano-imprint lithography techniques, forming a first spacer layer over the first features, etching the first spacer layer to form a first spacer pattern and to expose top of the first features, removing the first features, patterning the first hard mask, using the first spacer pattern as a mask, to form first hard mask features, removing the first spacer pattern, using nano-imprint lithography techniques to form second features over the first hard mask features, forming a second spacer layer over the second features, etching the second spacer layer to form a second spacer pattern and to expose top of the second features, removing the second features, etching the first hard mask features, using the second spacer pattern as a mask, to form second hard mask features, and etching at least part of the underlying layer using the second hard mask features as a mask.

In some embodiments, the first features comprise a plurality of first parallel lines extending in a first direction, and the second features comprise a plurality of second parallel lines extending in a second direction, wherein the second direction differs from the first direction by 30 to 90 degrees.

The first spacer layer and the second spacer layer may comprise a first material, and the first features and the second features comprise a second material different from the first material. For example, the first and second spacer layers may comprise oxide spacers, while the first features and the second features comprise imprinted features in an imprint resist layer.

Figure 2A:
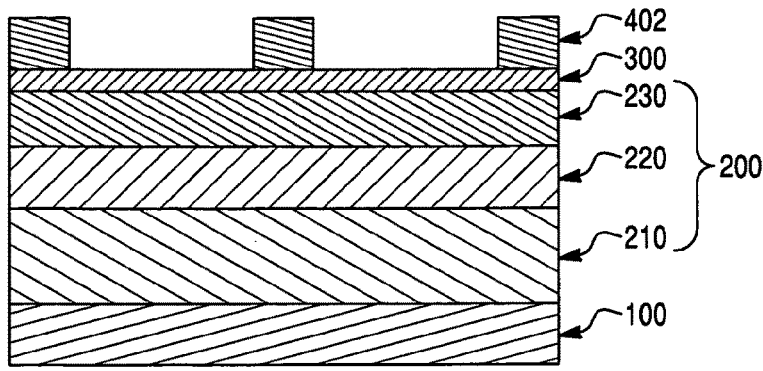
FIGS. 2A-2K are side cross-sectional views illustrating stages in formation of a device according to an embodiment of the present invention.

Referring to FIG. 2A, an underlying layer 200 is formed over a substrate 100. The substrate 100 can be any semiconductor substrate known in the art, such as monocrystalline silicon, IV-IV compounds such as silicon-germanium or silicon carbide, III-V compounds, II-VI compounds, epitaxial layers over such substrates, or any other semiconductor or non-semiconductor material, such as glass, plastic, metal or ceramic substrate. The substrate may include integrated circuits fabricated thereon, such as driver circuits and/or electrodes for a memory device.

The underlying layer 200 may comprise a second hard mask layer 230, an underlying hard mask layer 220, a device layer 210, or combinations thereof. For example, as shown in FIG. 2A, the underlying layer 200 may comprise a device layer 210, an underlying hard mask layer 220 formed over the device layer 210, and a second hard mask layer 230 formed over the underlying mask layer 220. A first hard mask layer 300 can be formed over the underlying layer 200.

The second hard mask layer 230 may comprise any suitable hard mask material including oxide, nitride, polysilicon, amorphous silicon, or metal. In one embodiment, the second hard mask layer 230 comprises a silicon oxide, silicon nitride or other hard mask layer. In another preferred embodiment, the second hard mask layer 230 comprises polysilicon. In an embodiment, the second hard mask layer 230 comprises a DARC layer, such as a silicon oxynitride layer. Preferably, the second hard mask layer 230 comprises a material different from the material of the first hard mask layer 300, so that the second hard mask layer 230 may act as an etch stop during steps of etching the first hard mask layer 300. The second hard mask layer 230 may have any suitable thickness, e.g. a thickness of 30 to 60 nanometers.

The underlying hard mask layer 220 may comprise any suitable hard mask materials, and in a preferred embodiment, comprises an organic hard mask, such as amorphous carbon film (advanced patterning film, APF). The underlying hard mask layer 220 may have a thickness of 1200 to 2500 nanometers. In an alternative embodiment, the first hard mask layer 300 may comprise an amorphous silicon layer and the underlying layer 200 comprises a DARC hard mask layer over the device layer 210. Other layer combinations may also be used.

The device layer 210 may comprise any suitable material, for example, semiconductor materials, insulating materials, or conductive materials. For example, in one preferred embodiment, the device layer 210 one or more is a polysilicon layers having a thickness of 1200 to 2500 nanometers.

The first mask layer 300 may comprise any suitable hard mask material. In a preferred embodiment, the first mask layer 300 comprises a silicon (e.g. poly- or a-Si) layer, having a thickness from 15 to 45 nanometers.

As described in greater detail below with respect to FIGS. 4A-4D, first features 402 can then be formed using nano-imprint lithography techniques over the first mask layer 300. The first features 402 may be formed from nano-imprint resist material. As shown in FIG. 2A, the first mask layer 300 can be partially exposed in openings between the first features 402. In some embodiments, the first features 402 can be imprint resist features in combination with other materials located below the resist material, e.g., BARC, DARC or silicon material. Alternatively, the first features 402 can be features including any other suitable materials, such as oxides, nitrides, or metals. In another embodiment, first features 402 may exclude the imprint resist material and can be made of any of the above described materials. The features 402 are formed by using a nano-imprint resist as a mask and then removing the nano-imprint resist.

Figure 2B:
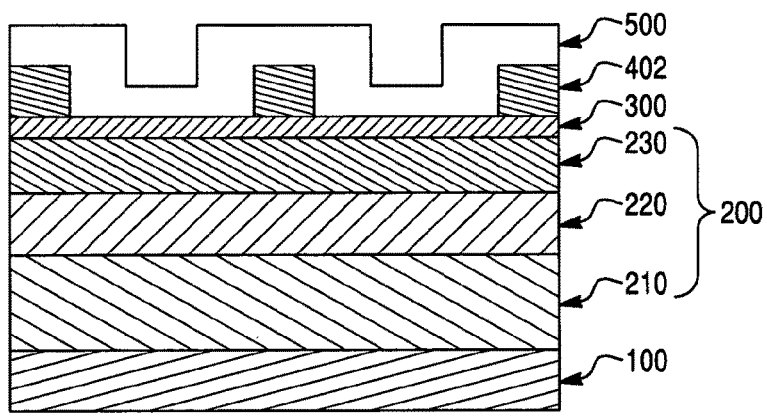

Turning to FIG. 2B, a first spacer layer 500 can be formed over the first features 402. The first spacer layer 500 comprises a first material different from the material of the first features 402. The spacer layer 500 may comprise any layer which is deposited at a sufficiently low temperature to avoid damaging the resist features 402 and which can withstand resist stripping without being removed. For example, layer 500 may comprise a low temperature silicon oxide layer deposited by atomic layer deposition (ALD or PLD) or by CVD at a temperature of 20-100, such as 80-100° C.

Figure 2C:
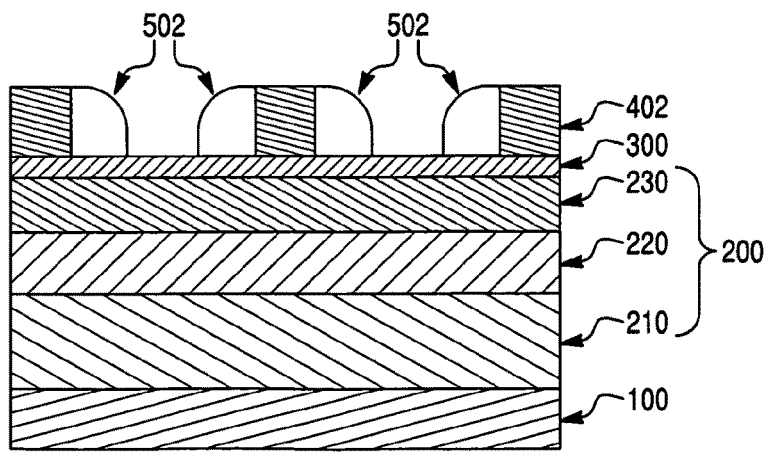

The first spacer layer 500 can then be etched using a spacer etch process to form a first spacer pattern (which can also be referred to as spacer features) 502 and to expose top of the first features 402, resulting in a structure illustrated in FIG. 2C.

Figure 2D:
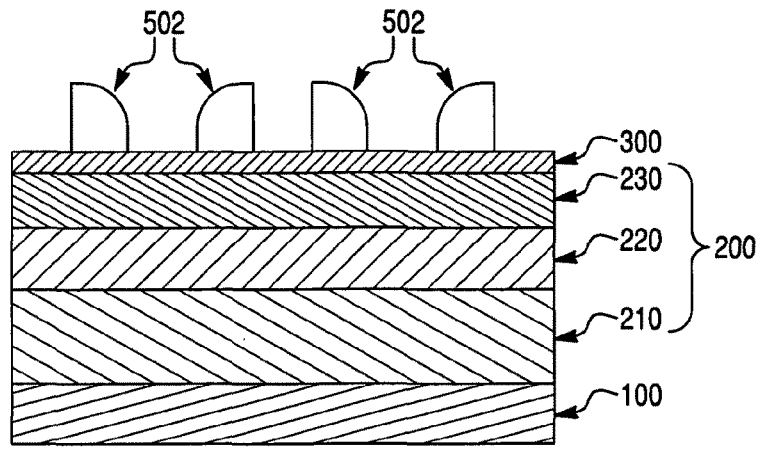

The first features 402 can then be removed (e.g., stripped) without removing pattern 502. The first spacer pattern 502, as shown in FIG. 2D, can be used as a mask in a following step of etching the first hard mask layer 300 to form first hard mask features 302. The first spacer pattern 502 can then be removed, resulting in a structure shown in FIG. 2E.

Figure 2E:
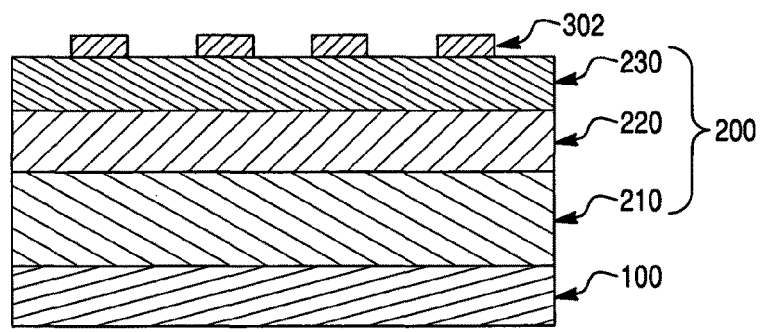
Figure 3A:
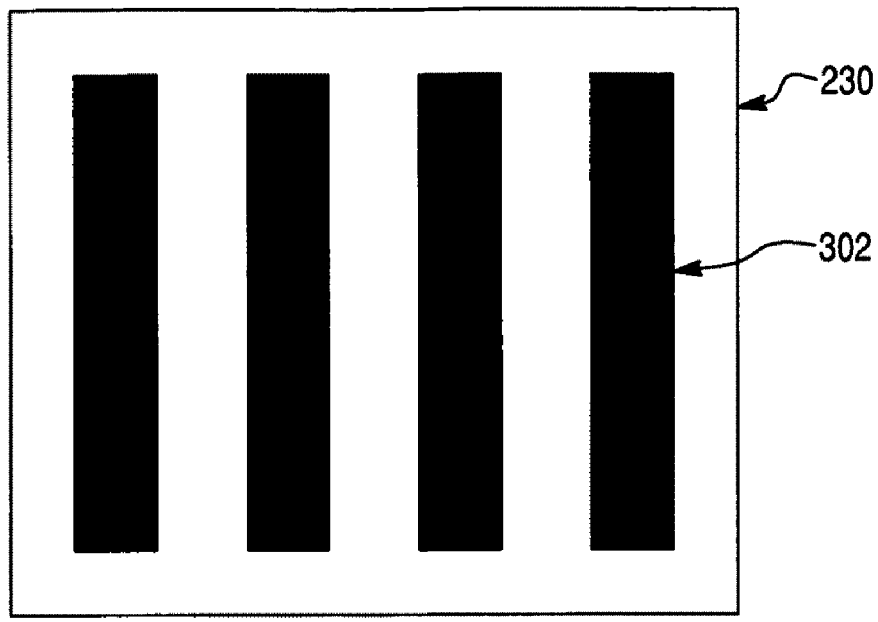
FIGS. 3A-3E are top views of the structures shown in FIGS. 2E-2I, respectively.

In some embodiments, the first features 402 comprise a plurality of first parallel lines extending in a first direction. Thus, the first hard mask features 302 formed by above steps may also comprise a plurality of parallel lines extending in the first direction, as illustrated in FIG. 3A (top view of the same structure shown in FIG. 2E).

Figure 2F:
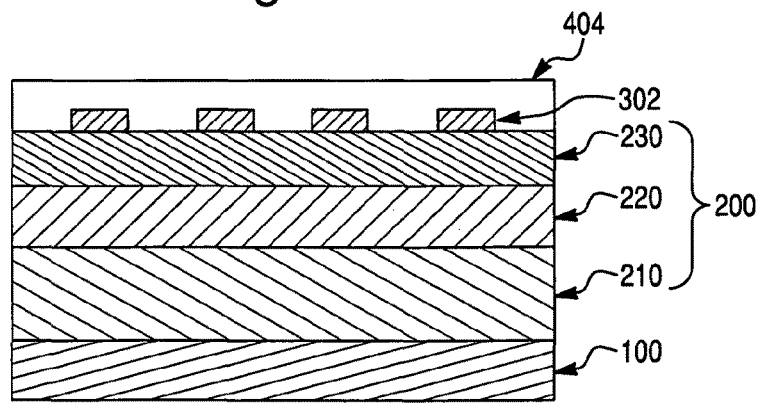

Turning to FIG. 2F, second features 404 formed by nano-imprint lithography can then be formed over and between the first hard mask features 302. Features comprise a plurality of second parallel lines or rails extending in a second direction. The second direction can be any direction different from the first direction. In preferred embodiments, the second direction differs from the first direction by 30 to 90 degrees. For example, in some embodiments, a structure containing line-shaped second features 404 extending in a direction perpendicular to the line-shaped first hard mask features 302 as shown in FIG. 2F (side cross-sectional view) and 3B (top view) may be formed.

Figure 2G:
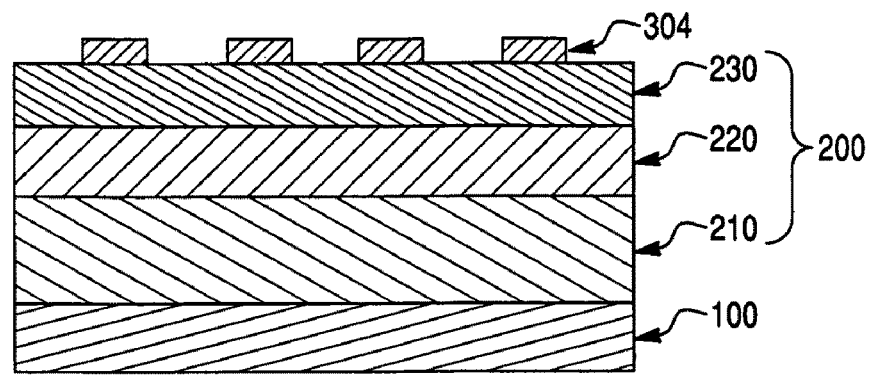
Figure 2H:
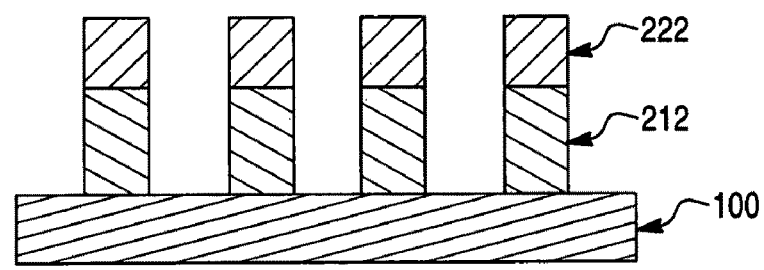
Figure 2I:
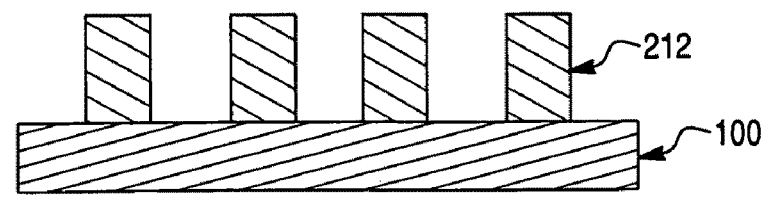
Figure 2J:
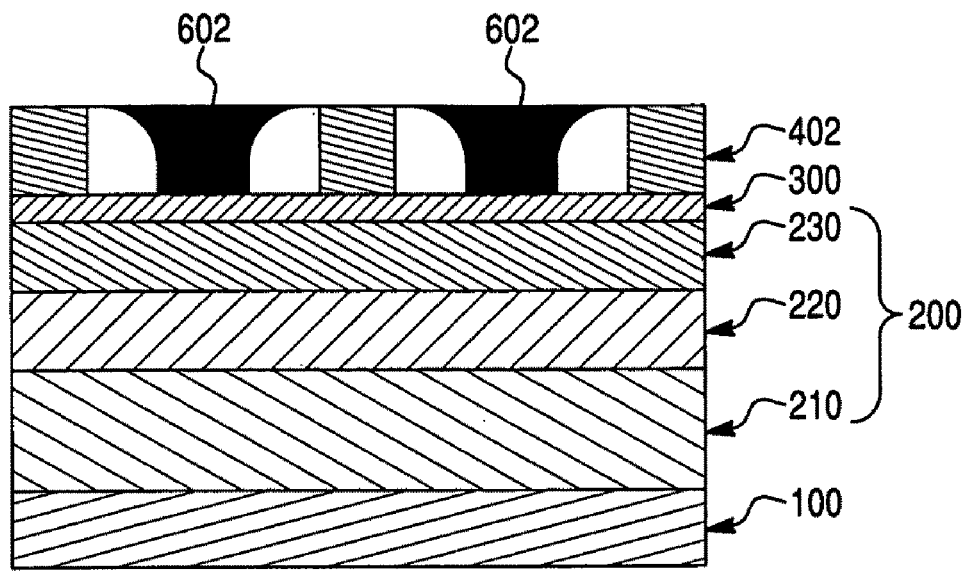
Figure 2K:
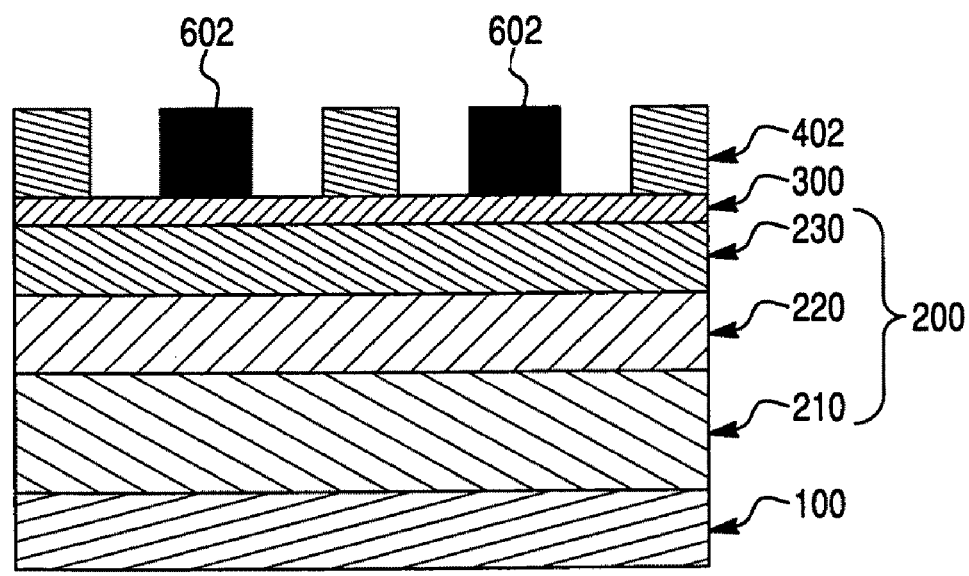

In an alternative embodiment, rather than removing the first features 402 as shown in FIG. 2D, first filler features 602 can be formed in the openings located between the spacer features 502, as illustrated in FIG. 2J. Then, the spacer features 502 are removed as shown in FIG. 2K. In this embodiment, a combination of the first filler features 602 and the first features 402, instead of the spacer features 502, are used a mask for etching the first hard mask layer 300 to form the first hard mask features 302, as shown in FIG. 2E.

Similar steps to those shown in FIGS. 2B-2E can then be conducted to form second hard mask features 304, resulting in a structure illustrated in FIGS. 2G (side cross-sectional view) and 3C (top view). For example, in some embodiments, the steps may comprise forming a second spacer layer (not shown) over the second features 404, etching the second spacer layer to form a second spacer pattern (not shown) and to expose top of the second features 404, removing the second features 404, etching the first hard mask features 302 using the second spacer pattern as a mask, and removing the second spacer pattern. The features 302 have a square, rectangular or quasi-rectangular shape (i.e., square or rectangle with rounded corners).

At least part of the underlying layer 200 can then be etched, using the second hard mask features 304 as a mask. In a preferred embodiment, the second hard mask layer 230 can be etched first using the second hard mask features 304 as a mask. The patterned second hard mask layer can then be used as a mask for etching the underlying hard mask layer 220 and the device layer 210. In some embodiments, the second hard mask layer 230 and a top portion of the underlying hard mask layer 220 may be removed during the step of etching the device layer 210. In a preferred embodiment, as shown in FIG. 2H (side cross-sectional view) and 3D (top view), an array of pillars 212, on top of which underlying hard mask features 222 (patterned underlying hard mask layer 220) remain may be obtained. In some embodiments, the remaining underlying hard mask features 222 can then be removed, resulting in a structure illustrated in FIG. 2I (side cross-sectional view) and 3E (top view).

The device layer 210 may comprise at least one semiconductor layer, and the step of patterning the device layer 200 forms an array of semiconductor pillars 212. Any suitable semiconductor materials such as silicon, germanium, silicon germanium, or other compound semiconductor materials, may be used. In these embodiments, each pillar 212 may comprise a diode. The diode 110 may be a steering element of a memory cell, for example, a memory cell 1 illustrated in FIG. 1B, which further includes a storage element 118. The storage element may comprise a resistivity switching element. The resistivity switching element can be a metal oxide antifuse dielectric layer or another element, and the diode and the metal oxide antifuse dielectric layer can be arranged in series.

Figure 10A:
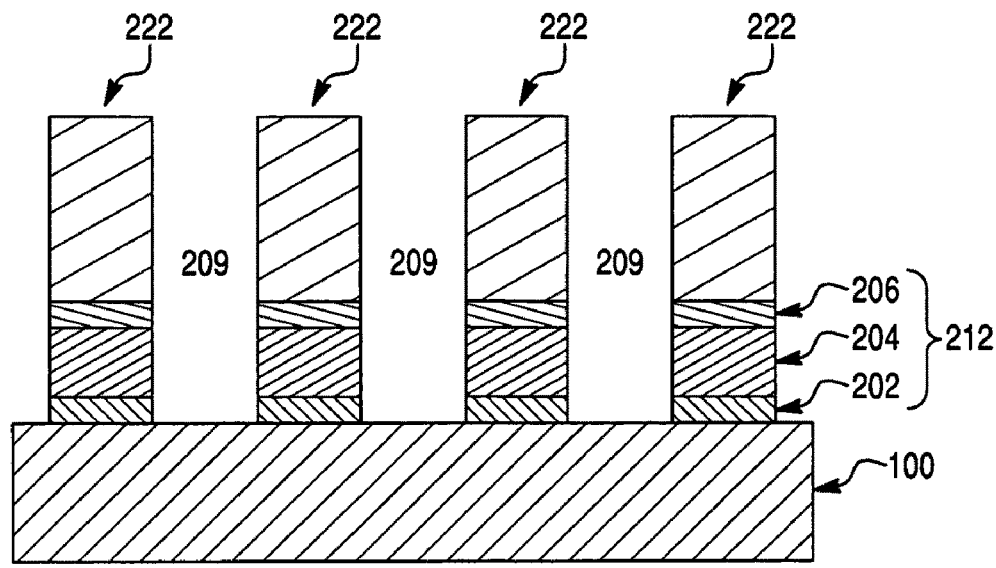
FIGS. 10A-10D are side cross-sectional views illustrating stages in formation of a device according to an embodiment of the present invention.

Alternatively, the device layer 210 comprises a resistivity switching storage element layer, for example, a metal-insulator-metal stack. As explained above, the step of etching the underlying layer 200 using the second hard mask features 304 as a mask, may result in pillars 212, on which underlying hard mask features 222 remain. In one embodiment, as shown in FIG. 10A, the pillars 212 (resistivity switching elements in this embodiment) may contain a first electrically conductive layer 202, an insulating layer 204 over the first electrically conductive layer 202, and a second electrically conductive layer 206. Any suitable conductive material can be used for the first 202 and second 206 conductive layers, for example, tungsten, aluminum, copper, or alloys thereof. The insulating layer 204 can be an antifuse dielectric layer selected from a group consisting of silicon oxide, hafnium oxide, aluminum oxide, titanium oxide, lanthanum oxide, tantalum oxide, ruthenium oxide, zirconium silicon oxide, aluminum silicon oxide, hafnium silicon oxide, hafnium aluminum oxide, hafnium silicon oxynitride, zirconium silicon aluminum oxide, hafnium aluminum silicon oxide, hafnium aluminum silicon oxynitride, zirconium silicon aluminum oxynitride, silicon oxide, silicon nitride, or combinations thereof.

Figure 10B:
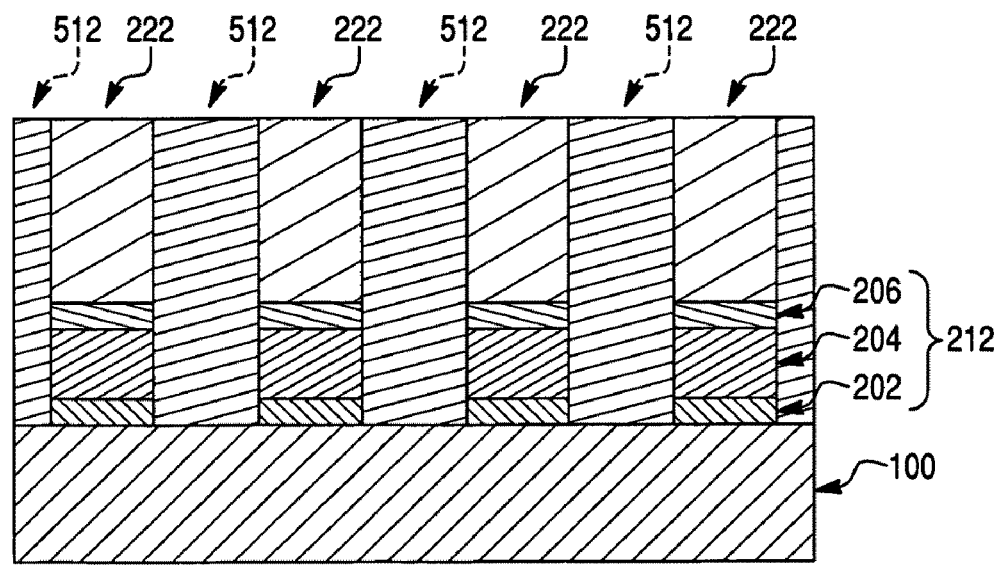

First openings 209 are formed between adjacent pillars 212 as illustrated in FIG. 10A. Turning to FIG. 10B, openings 209 are filled by an insulating material 512. Any suitable insulating material can be used for the insulating layer 512, for example silicon oxide, silicon nitride, high-dielectric constant film, Si—C—O—H film, or a combination thereof.

Figure 10C:
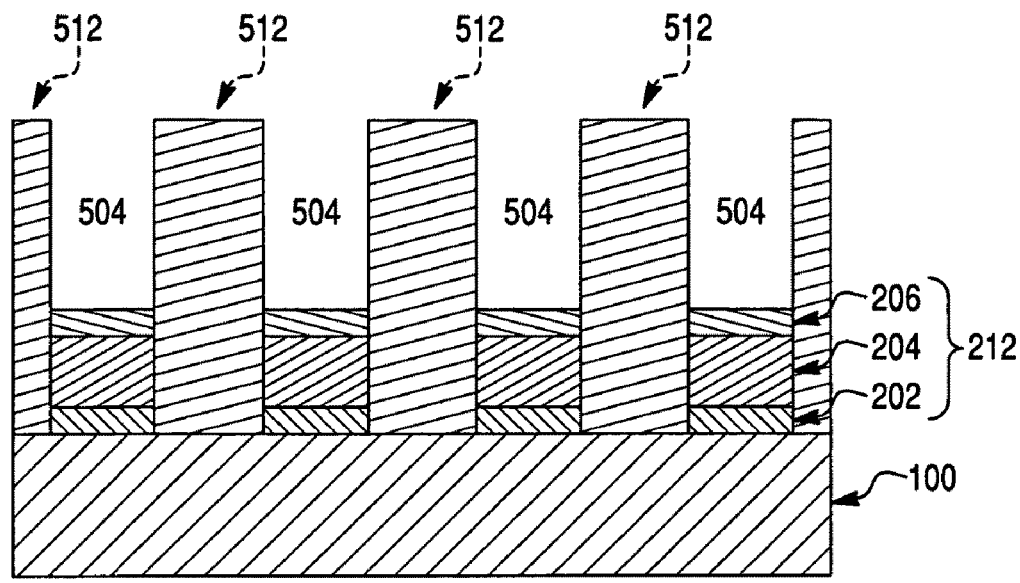
Figure 10D:
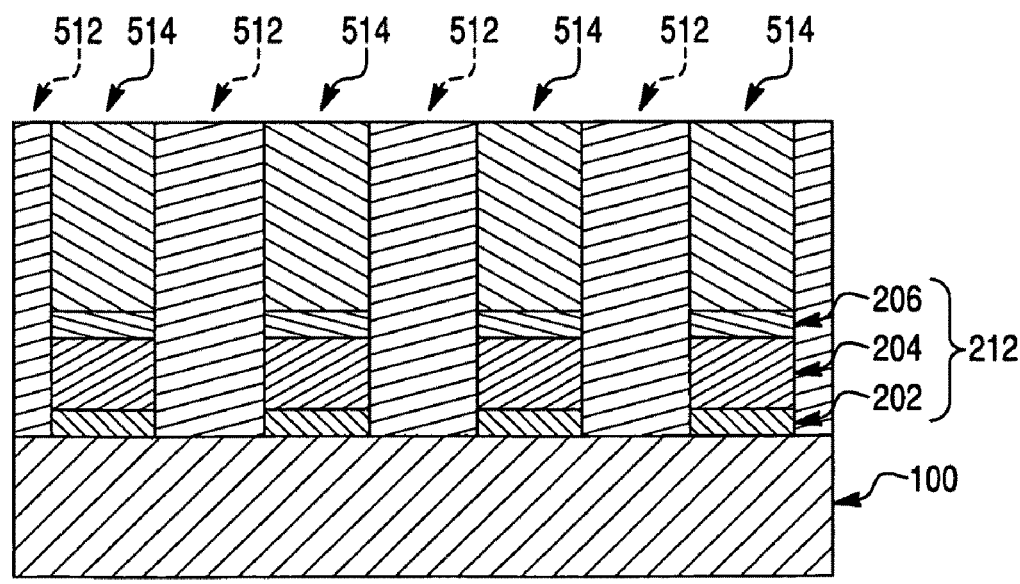

The underlying hard mask features 222 can then be selectively removed, as shown in FIG. 10C, forming second openings 504 exposing top of the resistivity switching storage element 212. The second openings 504 can then be filled with at least one semiconductor material to form semiconductor diodes 514, as shown in FIG. 10D. The semiconductor diodes 514 may have a substantially pillar shape, and may be a steering element of a memory cell, for example, the memory cell I illustrated in FIG. 1B.

The step of filling the second openings 504 may comprise selectively growing the semiconductor material of diodes 514 in the second openings 504. Alternatively, the step of filling the second openings 504 may comprise depositing the semiconductor material non-selectively over insulating layer 512 and into the second openings 504, and planarizing the semiconductor material such that the semiconductor material remains in the second openings 504. The p-type, n-type and optionally intrinsic diode regions may be deposited separately or the upper most layer (p or n-type) may be formed by implanting p or n-type dopants into the intrinsic region.

In some other embodiments, the device layer 210 comprises an electrically conductive material, such as a metal or metal alloy. In these embodiments, rather than etching the underlying layer using the second hard mask features 304 as a mask, the underlying layer is etched using the first hard mask features 302, comprising a plurality of lines, as a mask. In a preferred embodiment, the electrically conductive material can be patterned into line shaped electrodes, which may be electrodes of a memory cell, for example, top and/or bottom electrodes 101, 102 (i.e., bit lines and/or word lines) of a memory cell 1 illustrated in FIG. 1B, which further includes a storage element 118 and a steering element 110. Thus, the method of the embodiments of the invention may be used to form the line shaped electrodes using a single nano-imprint patterning step or pillar shaped device, such as steering and/or storage elements of a memory cell using two patterning steps.

The memory cell can be further located in a monolithic three dimensional array of memory cells. The memory cell can be a read/write memory cell or a rewritable memory cell. The memory cell type (i.e., the resistivity switching storage element 118) can be selected from at least one of antifuse, fuse, polysilicon memory effect cell, metal oxide memory, switchable complex metal oxide, carbon nanotube memory, graphene, amorphous or polycrystalline carbon switchable resistance material, phase change material memory, conductive bridge element, or switchable polymer memory. U.S. application Ser. Nos. 11/864,532 and 11/819,595, U.S. Published Application Numbers US 2007/0164309 A1 and US 2007/0072360 A1, and U.S. Pat. Nos. 6,946,719, 6,952,030, 6,853,049, disclosing memory cells and methods of making and/or using thereof, are hereby incorporated by reference in their entirety.

In preferred embodiments, the memory cell includes a cylindrical, quasi-cylindrical or right angle parallelepiped semiconductor diode located in series with the storage element. The diode and the storage element are disposed between two electrodes, as illustrated in FIG. 1B. For a detailed description of a the design of a memory cell comprising a diode and an antifuse, see for example U.S. patent application Ser. No. 11/125,939 filed on May 9, 2005 (which corresponds to US Published Application No. 2006/0250836 to Herner et al.), and U.S. patent application Ser. No. 11/395, 995 filed on Mar. 31, 2006 (which corresponds to US Patent Published Application No. 2006/0250837 to Herner et al.), each of which is hereby incorporated by reference. In the preferred embodiments of the invention, the storage element is the resistivity switching material and the diode as the steering element of the memory cell. Each pillar memory cell 110/118 may have a critical dimension below 32 nm, such as 22 nm, 11 nm or less and adjacent pillars may be spaced apart by less than 100 nm, such as 80-88 nm for example.

As a non-limiting example, FIG. 1B illustrates the perspective view of a memory cell formed according to a preferred embodiment of the present invention. A bottom conductor 101 is formed of a conductive material, for example tungsten, and extends in a first direction. Barrier and adhesion layers, such as TiN layers, may be included in bottom conductor 101. The semiconductor diode 110 has a bottom heavily doped n-type region 112; an intrinsic region 114, which is not intentionally doped; and a top heavily doped p-type region 116, though the orientation of this diode may be reversed. Such a diode, regardless of its orientation, will be referred to as a p-i-n diode or simply diode. The resistivity switching layer 118 is disposed on the diode, either on the p-type region 116 or below the n-region 112 of the diode 110. Top conductor 102 may be formed in the same manner and of the same materials as bottom conductor 101, and extends in a second direction different from the first direction. The semiconductor diode 110 is vertically disposed between bottom conductor 101 and top conductor 102. The diode can comprise any single crystal, polycrystalline, or amorphous semiconductor material, such as silicon, germanium, or silicon-germanium alloys. Layer 118 may comprise one or more of antifuse, fuse, polysilicon memory, metal oxide memory, switchable complex metal oxide, carbon nanotube layer, graphene, amorphous or polycrystalline carbon switchable resistance material layer, phase change material, conductive bridge element, or switchable polymer.

The above described memory cell shown in FIG. 1B may be located in a one memory level device. If desired, additional memory levels can be formed above the first memory level to form a monolithic three dimensional memory array. In some embodiments, conductors can be shared between memory levels; i.e. top conductor 102 shown in FIG. 1B would serve as the bottom conductor of the next memory level. In other embodiments, an interlevel dielectric is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Figure 4A:
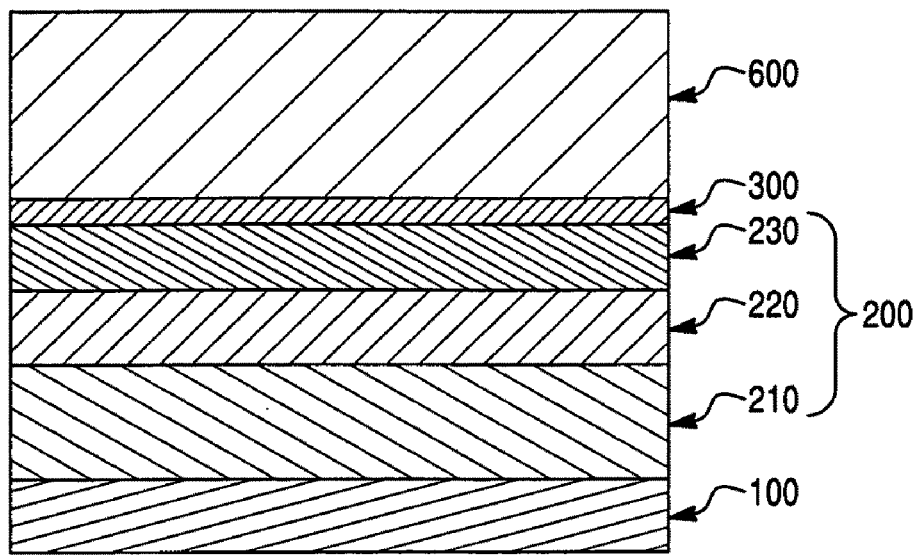
FIGS. 4A-4D are side views illustrating stages of nano-imprint lithographic patterning according to an embodiment of the present invention.

As noted above, first and second features 402 and 404 are formed using nano-imprint lithography techniques. FIGS. 4A-4D, show an exemplary imprint process. Turning to FIG. 4A imprint resist layer 600 is formed over hard mask layer 300. Imprint resist layer 600 may be any formed of and suitable imprint resist, e.g., silicon oxide, thermoplastic polymer, photocurable liquid (e.g. a UV curable low viscosity liquid), etc. Imprint resist layer 600 may be deposited using any suitable technique including, e.g., CVD techniques, spin coating, etc.

Figure 4B:
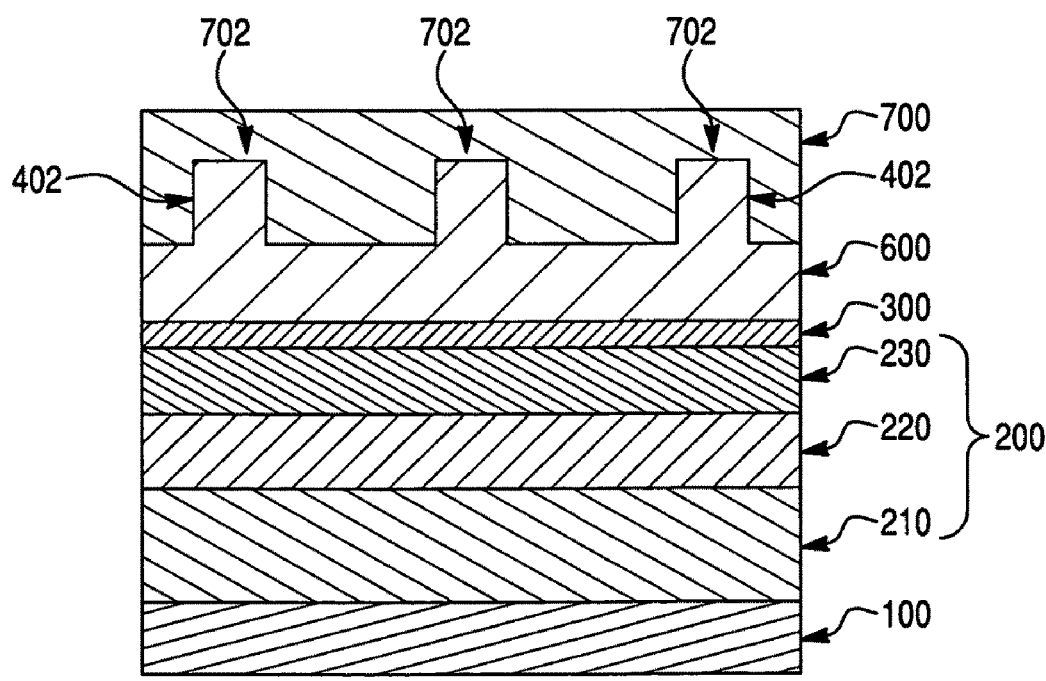

Referring to FIG. 4B, imprint template 700 includes template features 702. Imprint template 700 is brought into contact with imprint resist layer 600 to mold features 402 in negative relief to template features 702. Imprint template 700 may be any suitable template imprint template. For example, imprint template 700 may include a surface patterned using, e.g., electron beam patterning techniques. Such templates feature very precisely defined template features. Template 700 may include parallel line patterns with a pitch of 64 nm or less, or even 44 nm or less over fields of 33 mm by 26 mm or more. Such templates may be used to for imprint resist features 402 including a plurality of rail lines featuring line widths and spacings below 64 nm, e.g. 22 nm or less. These features may be precisely formed with minimal line edge width modulation and with substantially vertical sidewall profiles.

Figure 4C:
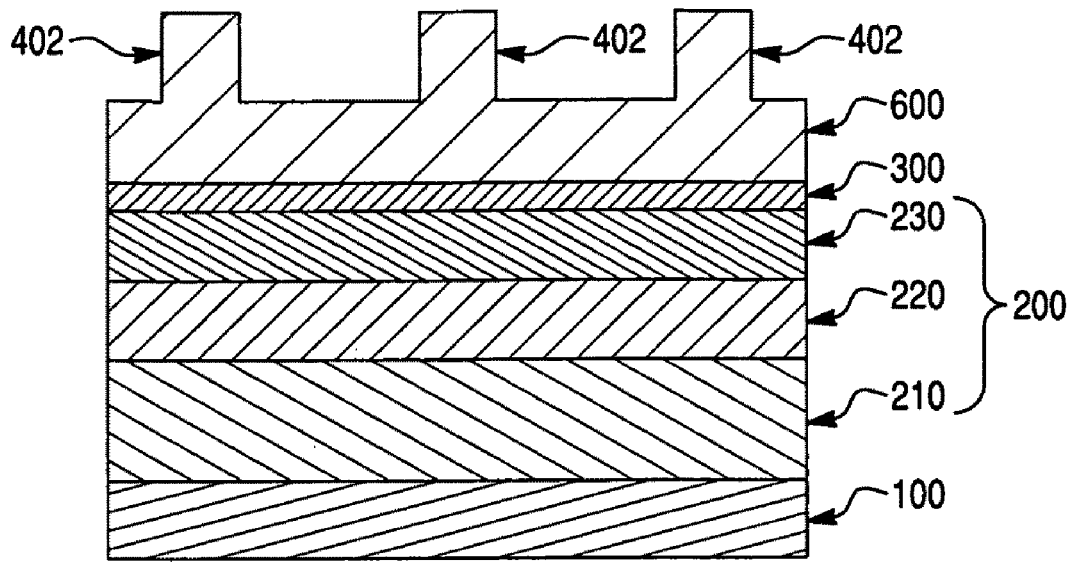

Referring to FIG. 4C, imprint template 700 is removed, exposing features 402. In some embodiments, imprint resist layer 600 may be cured prior to removal of imprint template 700. For example, in some embodiments, light energy (e.g., ultraviolet "UV" light) can be directed to imprint resist layer 600 to cause hardening of the layer. Other suitable curing techniques may be used, including thermal or electrochemical techniques.

Figure 4D:
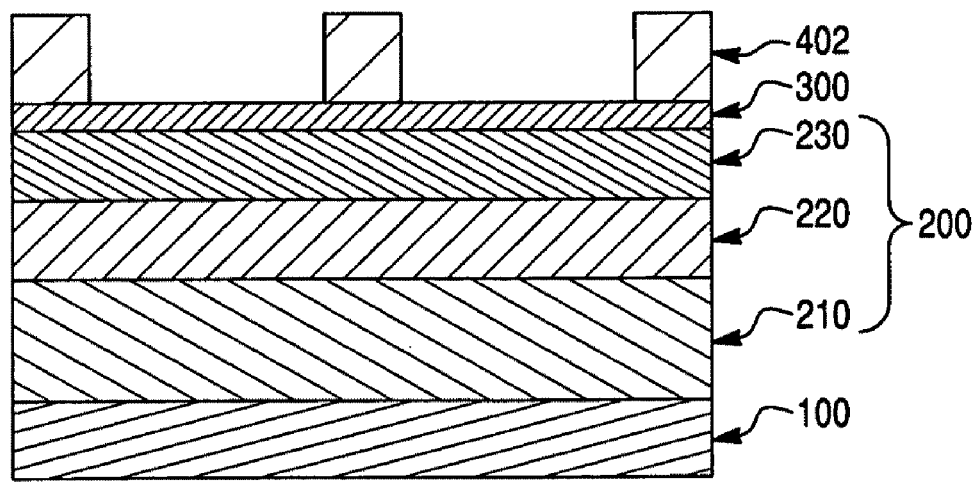

Referring to FIG. 4D, imprint resist layer 600 is trimmed and descummed using, for example, oxygen plasma processing. Following this processing, only features 402 remain above hard mask layer 300. This configuration is substantially identical to that shown in FIG. 2A.

Figure 3B:
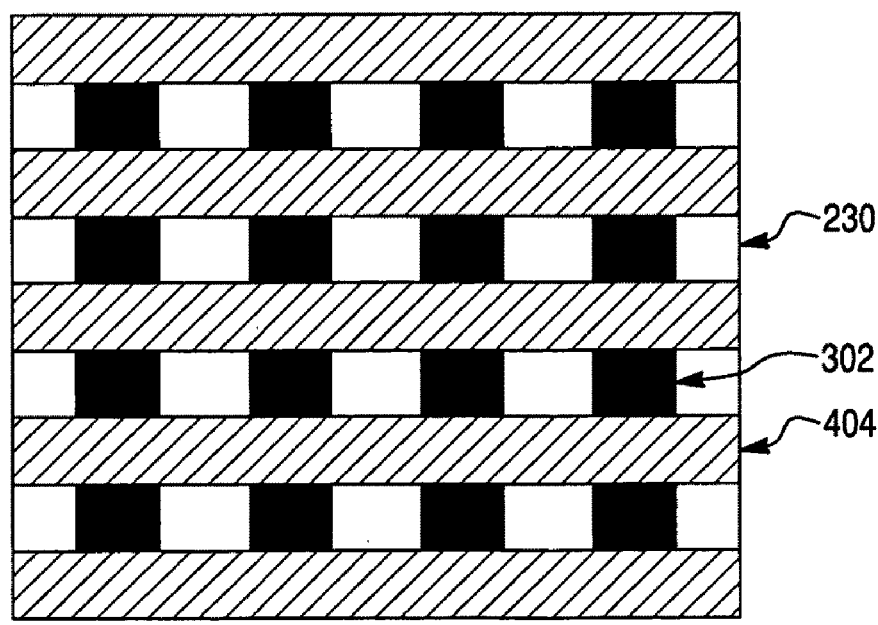
Figure 3C:
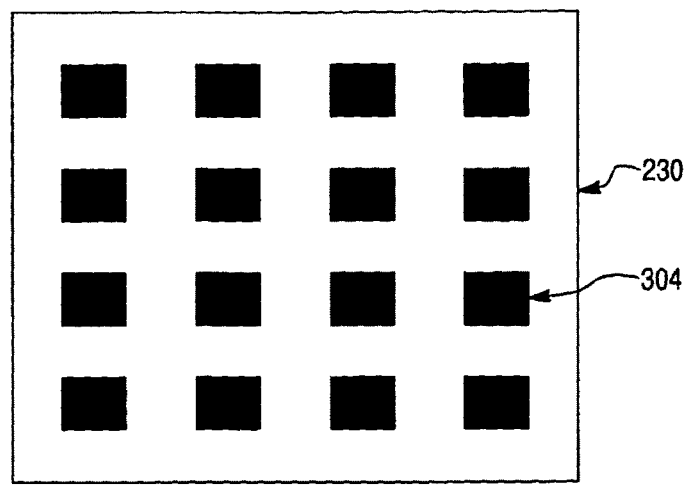
Figure 3D:
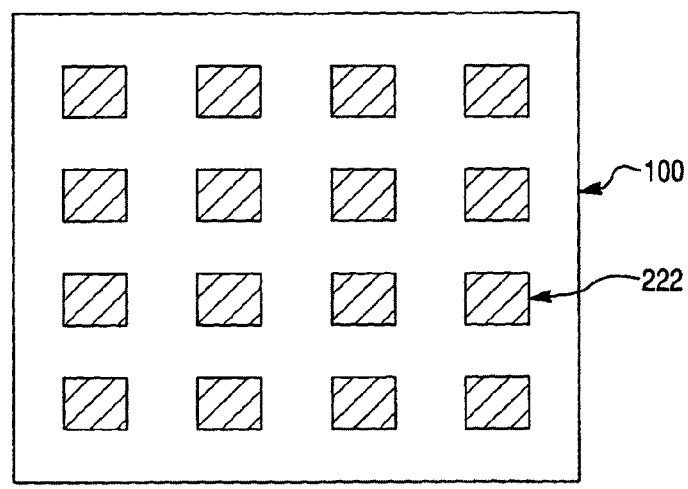
Figure 3E:
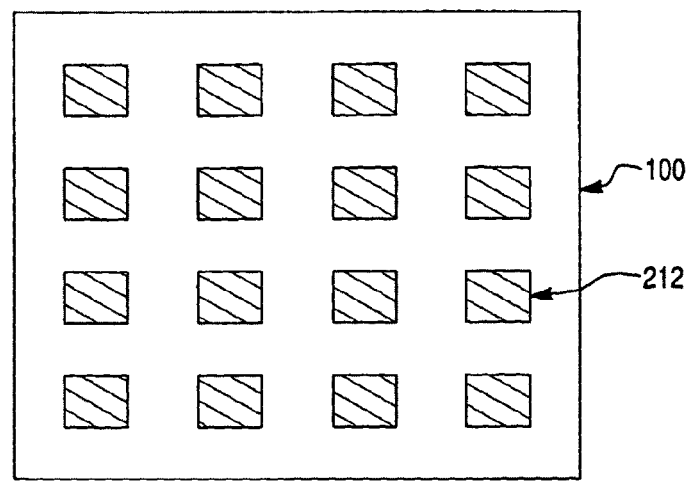

The above described nano-imprint process can be repeated to form second features 404 shown in FIG. 2F. In some embodiments, the same imprint template 700 is re-used at a different orientation, to form second features 404 along a direction different from that of first features 402 (e.g., as shown in FIG. 3B). Alternatively, different templates may be used for each patterning steps.

FIGS. 5A-5M show stages in an exemplary process for forming a device featuring pillar structures which combine the overall process flow of FIGS. 2 and 3 with the nano-imprint lithography steps of FIGS. 4A-4D. The process features two nano-imprint lithography patterning steps.

Figure 5A:
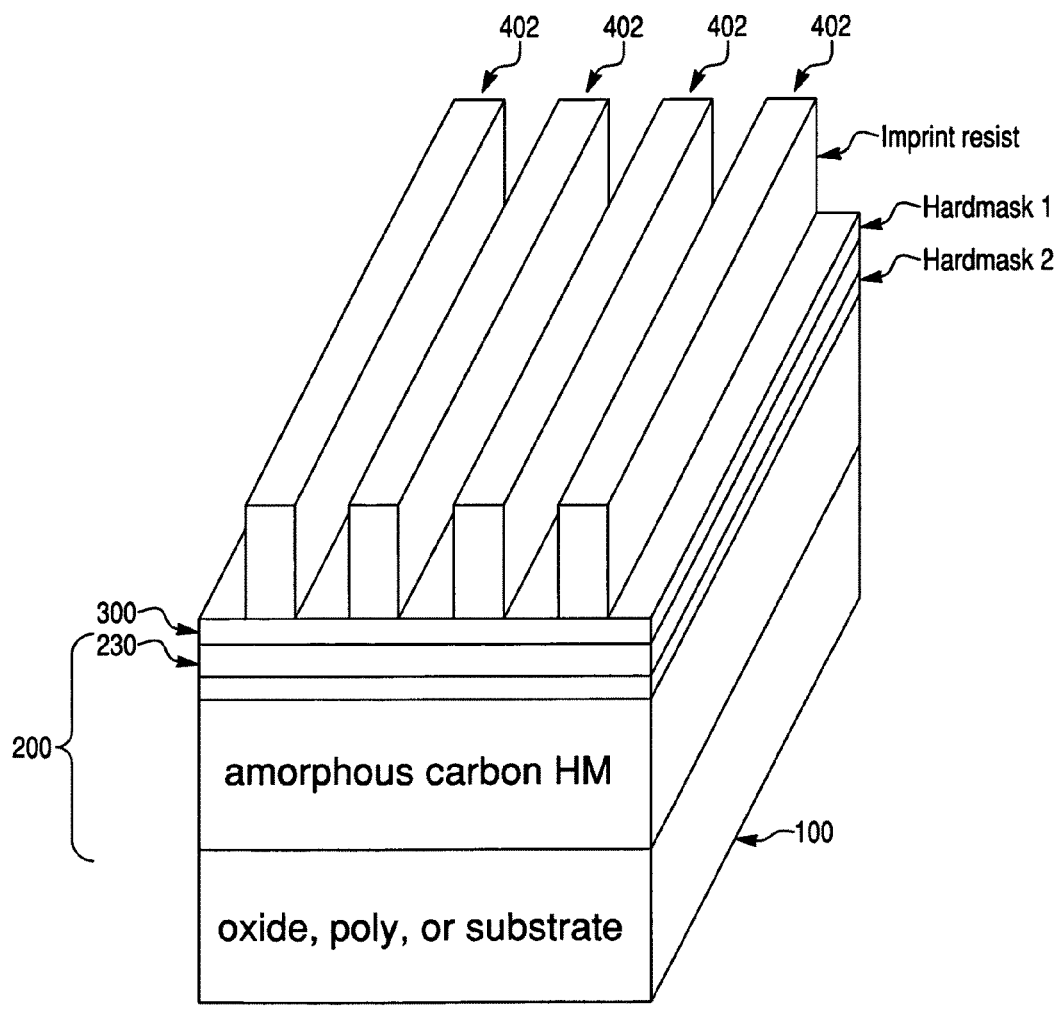
FIGS. 5A-5P are perspective views illustrating stages in formation of a device according to an embodiment of the present invention.

Referring to FIG. 5A, first features 402 are transferred from a nano-imprint template (not shown) to an imprint resist layer on first hard mask layer 300. In preferred embodiments, first hard mask layer 300 is a silicon layer (e.g. poly- or a-Si) between 15 nm and 45 nm in thickness. Underlying layer 200 includes second hard mask layer 230. In preferred embodiments, layer 230 is a silicon oxynitride or silicon nitride layer. Underlying layer 200 is formed on substrate 100. In some embodiments, substrate 100 may be replaced by an insulating material, such as an oxide, or a semiconductor layer, such as polycrystalline silicon layer. The semiconductor material for the diode 110 may be located as part of layer 200 and/or as part of substrate 100.

Figure 5B:
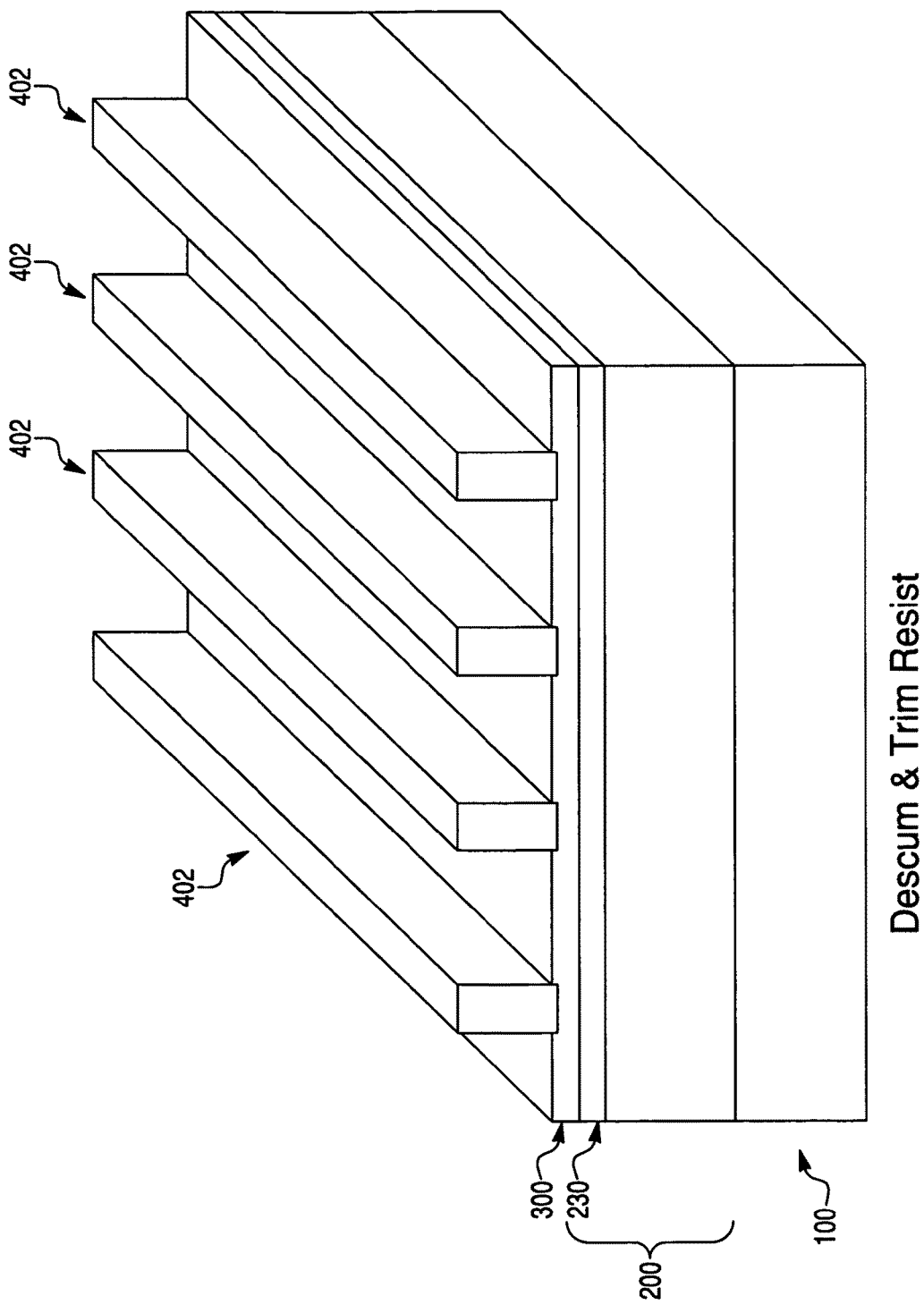

Referring to FIG. 5B, the imprint resist layer is trimmed and descummed, leaving only first features 402. In preferred embodiments, this step is accomplished using oxygen plasma processing.

Referring to FIG. 5C, spacer layer 500 is deposited over first features 402. In preferred embodiments, spacer layer 500 is formed as a low temperature silicon oxide layer deposited by atomic layer deposition (ALD).

Figure 5D:
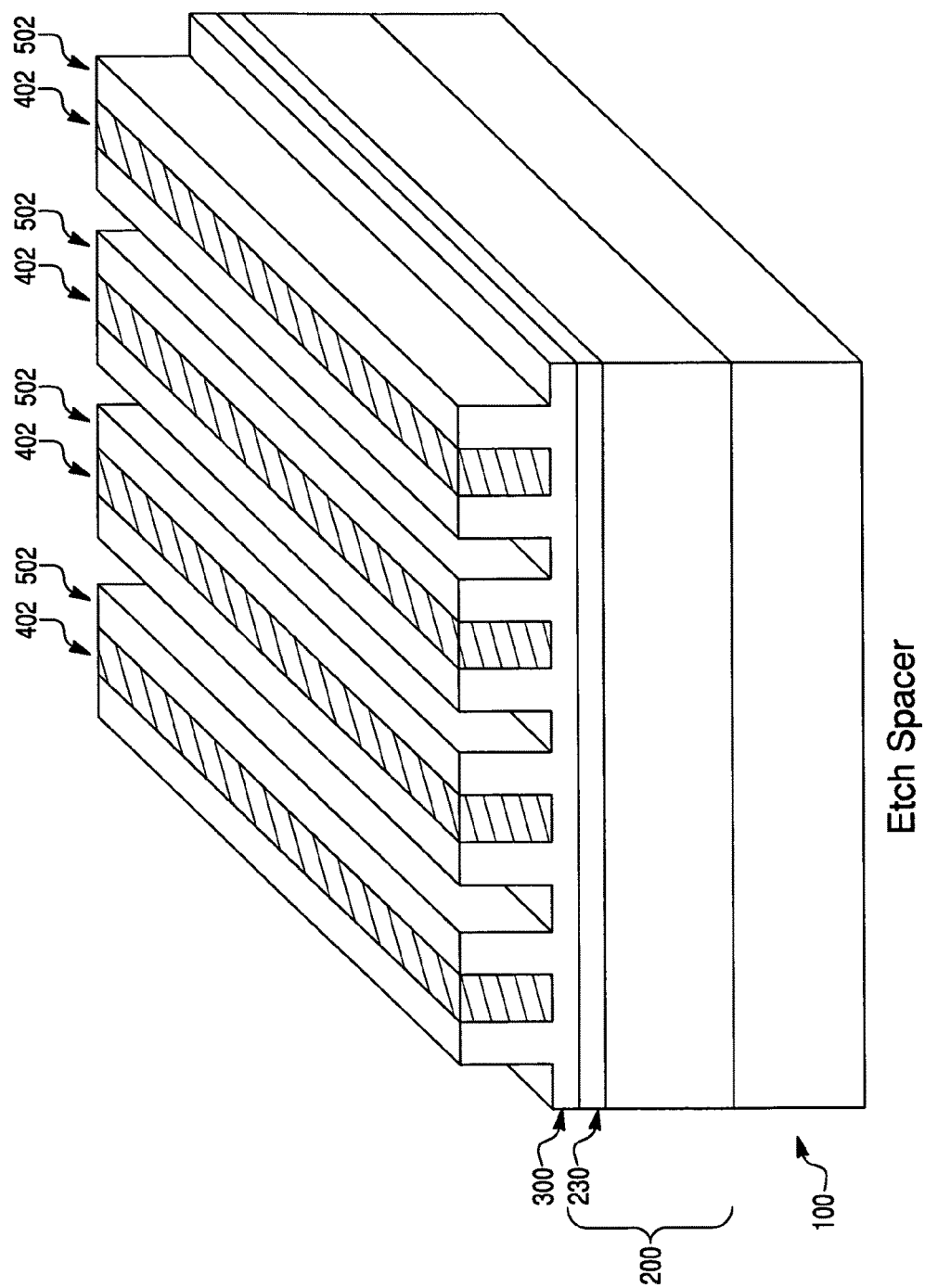
Figure 5M:
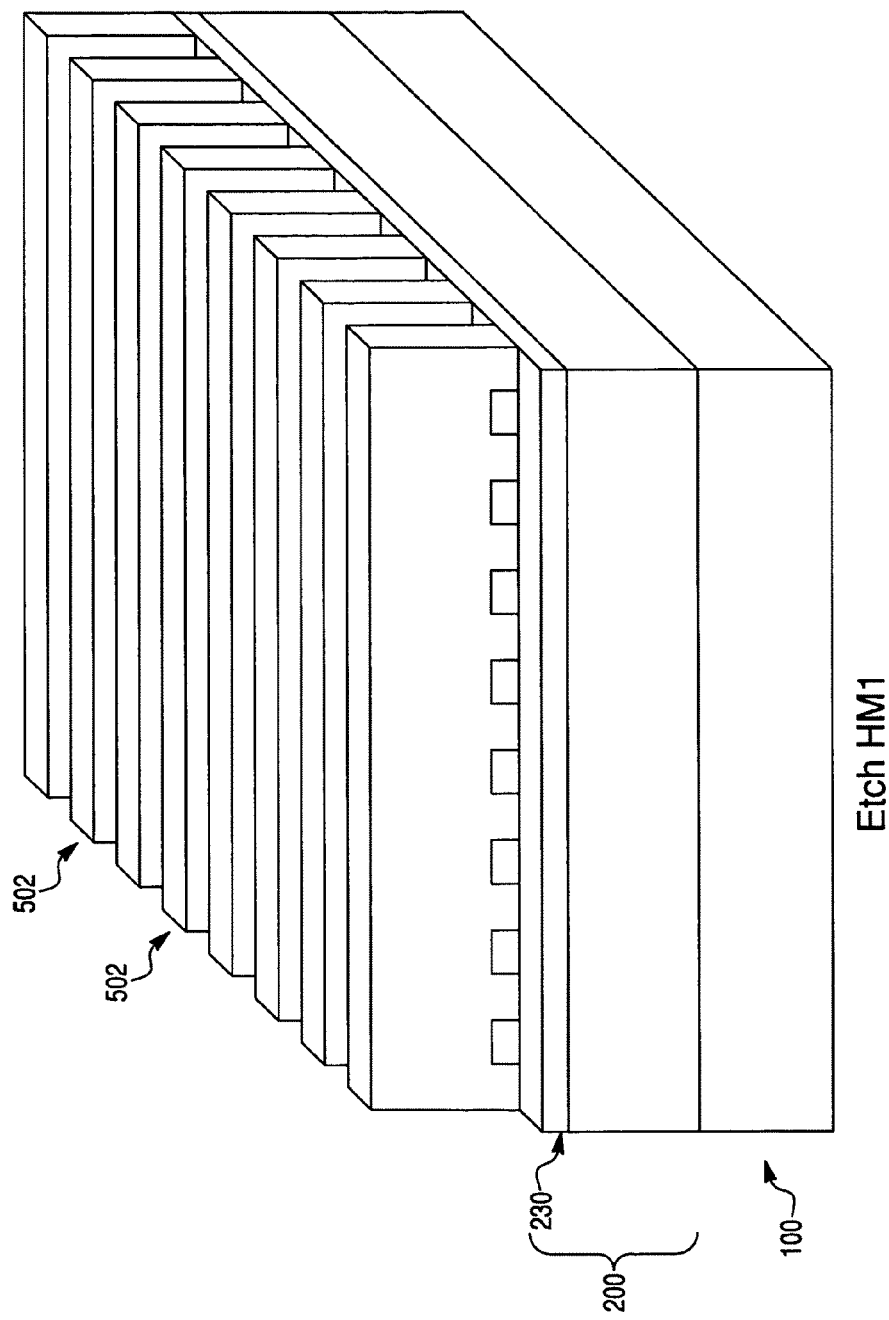

Referring to FIG. 5D, an oxide etch is used to etch spacer layer 500 to form spacer features 502 and expose the tops of first features 402. In preferred embodiments, the oxide etch is a $CHF_3$ etch process.

Referring to FIG. 5E, the imprint resist features 402 are removed ("ashed") from between spacer features 502, e.g., using an oxygen plasma process.

Referring to FIG. 5F, first hard mask layer 300 is etched away down to underlying hard mask layer 230. Hard mask features 302 are formed beneath spacer features 502. In embodiments where hard mask 300 is a silicon layer, it is preferably etched using an $HBr+Cl_2$ etch process.

Referring to FIG. 5G, spacer features 502 are removed, exposing hard mask features 302. In preferred embodiments, spacer features 502 are removed using an HF solution or HF vapor process.

Referring to FIG. 5H, an imprint resist layer is formed over hard mask features 502. A pattern is transferred from a nano-imprint template to the imprint resist letters to form second features 404 running perpendicular to hard mask features 302.

Referring to FIG. 5I, the imprint resist layer is trimmed and descummed, e.g. via an oxygen plasma process, to leave features 404. FIGS. 5J-5M essentially repeat the spacer feature formation steps and first hard mask etch step shown in FIGS. 5B through 5G. Referring to FIG. 5N, the result of these processing steps are island shaped second hard mask features 304 formed in hard mask layer 300.

Referring to FIG. 5O, hard mask layer 230 is etched down to the underlying amorphous carbon layer of underlying layer 200, forming underlying hard mask features 222 using features 304 as a mask. In preferred embodiments, hard mask 230 is etched using a $CHF_3+CF_4$ etch process.

Finally, referring to FIG. 5P, underlying layer 200 (including the amorphous carbon layer) is etched down to substrate 100, thereby forming an array of pillars 212 below underlying hard mask features 222.

Figure 1A:
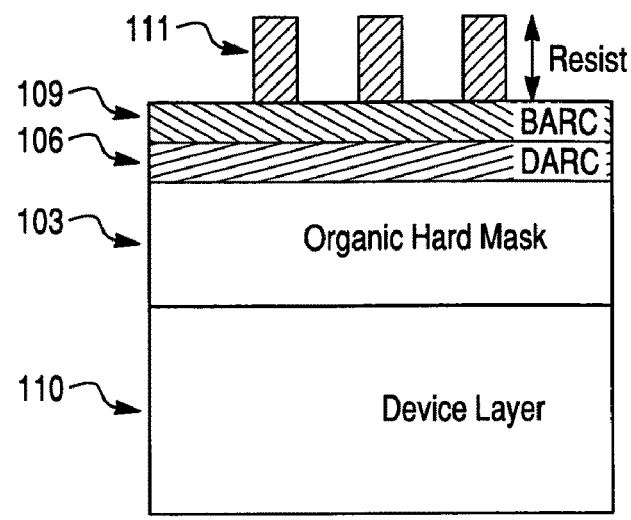
FIG. 1A is a side cross-sectional view illustrating a prior art hard mask configuration.
Figure 1B:
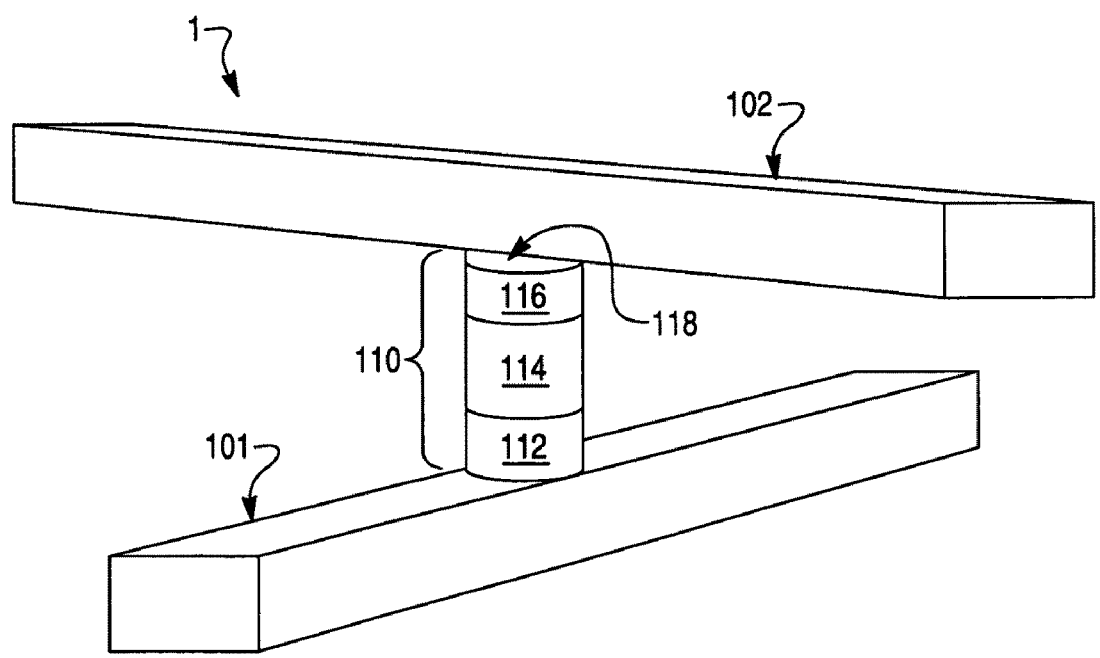
FIG. 1B is a perspective view of a memory cell formed according to an embodiment of the present invention.

The above described nano-imprint lithography based techniques provide a number of benefits in comparison to similar photolithography based techniques, such as that shown in FIG. 1A and those described in U.S. patent application Ser. No. 12/289,396, filed Oct. 27, 2008. In particular, nano-imprinted features avoid a number of defects caused by various optical effects often present in photolithographic schemes.

Figure 6:
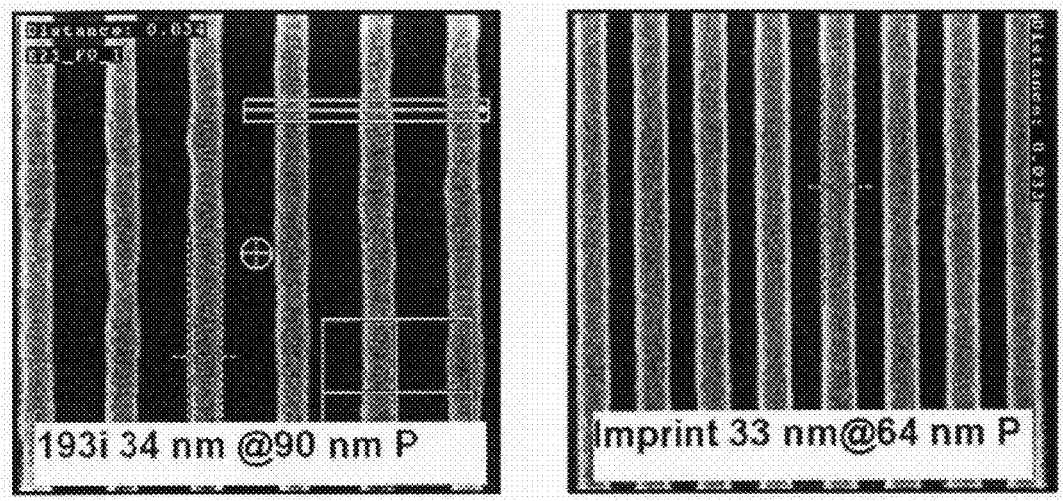
FIG. 6 shows a comparison of top view electron micrographs showing pattering results using photolithography and nano-imprint lithography.

As described above, a nano-imprint template may be patterned using very high resolution techniques, e.g., electron beam patterning. The template pattern is transferred to the imprint resist by direct mechanical processing. Accordingly, nano-imprint techniques are not subject to the optical resolution limits of currently available photolithographic, e.g., 193 nm ultraviolet immersion lithography ("193i"). Nano-imprint techniques may therefore be used to provide finer features. For example, FIG. 6 shows a comparison of an electron micrograph of a line pattern formed by the 193i photolithographic technique (left) and an electron micrograph of a line pattern formed by nano-imprint lithography (right). The photolithographic pattern is limited by optical resolution considerations to 34 nm line widths at 90 nm pitch, while the nano-imprint pattern obtains 33 nm line widths at 64 nm pitch. Further, the photolithography example evidences much larger line edge roughness, due to various optical effects.

Figure 7:
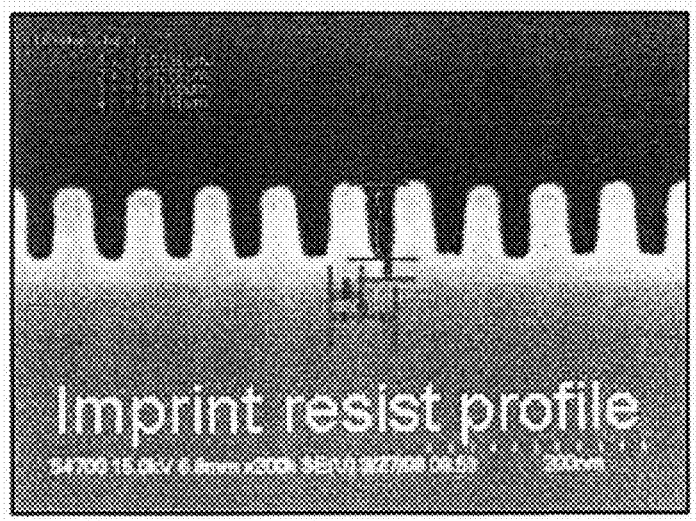
FIG. 7 is a side view electron micrograph showing a patterned nano-imprint resist profile.

Referring to FIG. 7, an electron micrograph is shown of an exemplary nano-lithography imprint profile. Note that the resist profile transferred from the imprint template is characterized by a very straight, substantially vertical sidewall profile. In contrast, resist profiles formed using photolithographic techniques typically feature substantially sloping sidewalls.

Further, the nano-imprint technique employs a negative resist, whereas typical photolithography techniques employ a positive resist (i.e. a resist where the portion of the photoresist that is exposed to light becomes soluble to the photoresist developer and the portion of the photoresist that is unexposed remains insoluble to the photoresist developer). This results in smoother line features in the nano-imprint case. Further, the nano-imprinted negative resist features can withstand higher temperatures during the deposition of spacer layers, e.g. as shown in FIG. 2B, than is possible when using typical positive photoresists.

Figure 8A:
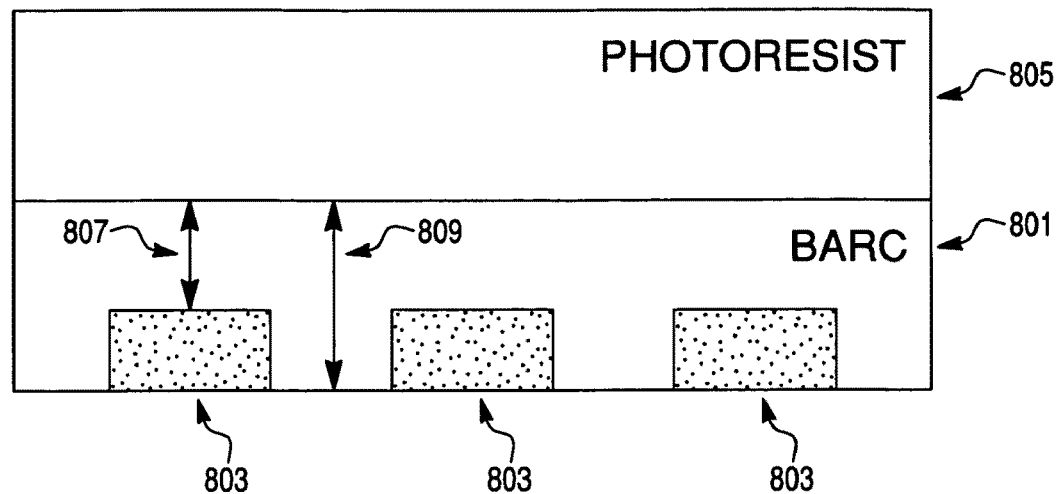
FIG. 8A is a side view illustrating second photolithographic patterning over an underlying patterned hard mask layer.

The inventors have also realized that nano-imprint lithography provides a particular benefit in processes which require a second lithographic patterning step for the formation of a second set of features over a previously patterned hard mask layer, e.g., as shown in FIG. 2. Referring to FIG. 8A, a typical second photolithographic pattering step is illustrated. BARC layer 801 is formed over first hard mask features 803. Photoresist layer 805 is formed over BARC layer 801 and exposed with light using suitable photolithographic techniques. Such techniques are characterized by a finite depth of focus, such that some of the exposure light will impinge on layers underlying photoresist layer 805. BARC layer 801 operates to suppress reflection of light from the underlying layers. Note however, that due to the topography of hard mask features 803, the thickness of BARC layer 801 is not uniform. Instead it is thinner in regions 807 located above features 803 and thicker in regions 809 not located above the features 803. Because of this variation, a greater amount of the exposure light is reflected from layers underlying the thinner regions 807 into photoresist layer 805. This results in uneven exposure of photoresist layer 805.

Figure 8B:
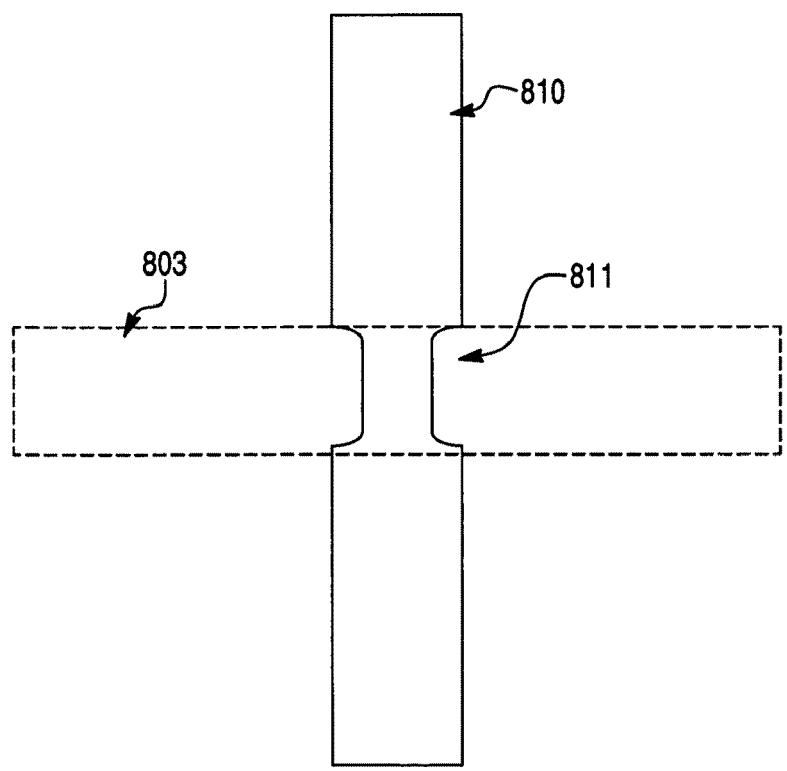
FIG. 8B is a top view illustrating the results of a second photolithographic patterning step over an underlying patterned hard mask layer.

FIG. 8B shows that the topological roughness caused by the first patterning step causes the uneven exposure of photoresist layer 805. This results in line edge width (LEW) modulation of the second photolithographic patterning. In regions 811 where the exposed lines 810 of photoresist layer 805 overlap patterned hard mask features 803, the exposed lines exhibit an unwanted narrowing or "necking" defects. This results in an unwanted modulation of the line width of the exposed lines in the perpendicular direction.

Figure 8C:
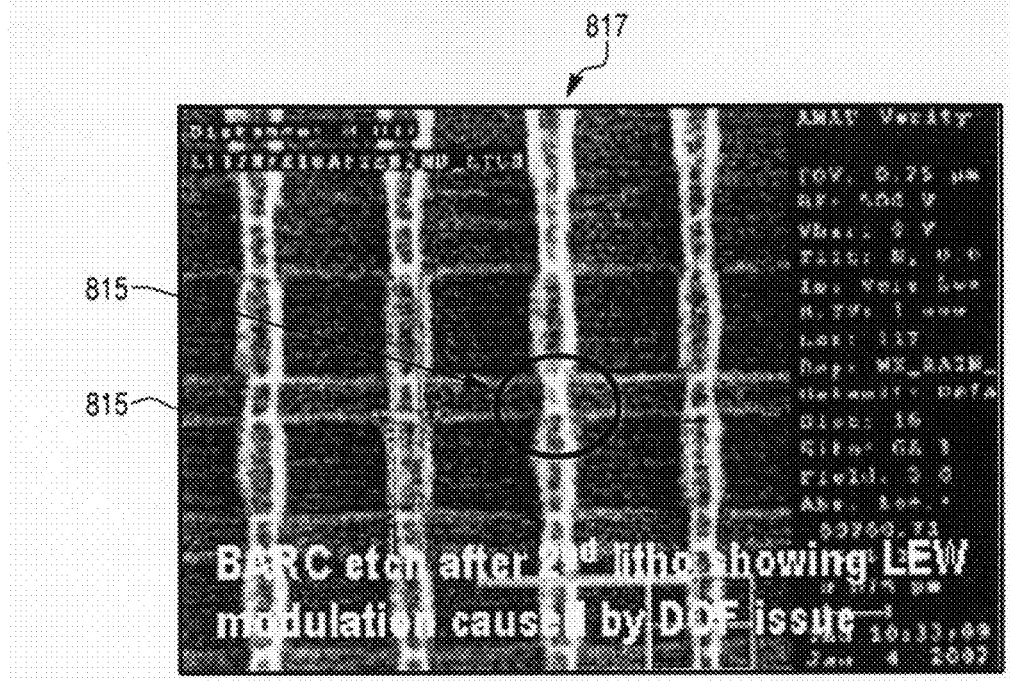
FIG. 8C is a top view electron micrograph showing the results of a second photolithographic patterning step over an underlying patterned hard mask layer.

FIG. 8C shows an electron micrograph of an exemplary structure following a second photolithographic patterning of the type described above. LEW modulation as a result of necking defects is apparent in areas such as regions 815 where the line features 817 and 813 from the first and second patterning steps overlap.

Figure 9:
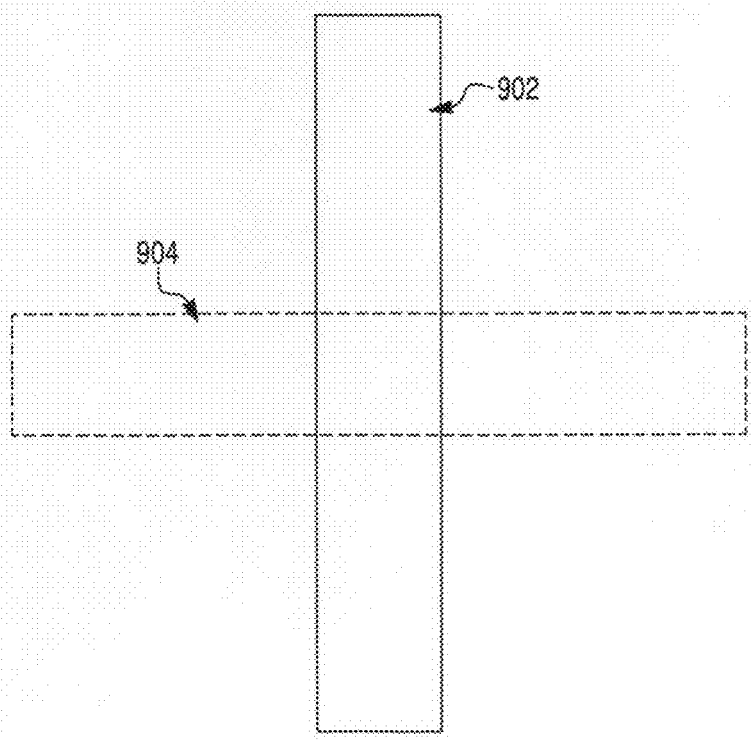
FIG. 9 is a top view illustrating the results of a second nano-imprint lithographic patterning step over an underlying patterned hard mask layer.

The above described LEW modulation is primarily the result of optical effects. Accordingly, this type of defect is avoided by employing nano-imprint techniques to provide the second patterning step, as described above. As shown in FIG. 9, imprinted line feature 902 formed in a second patterning step exhibits substantially no defects (e.g., no LEW modulation) as a result of the underlying topography of patterned hard mask layer 904.

Moreover, in embodiments which include only a single nano-imprint patterning step, formation and subsequent etching of a BARC layer may be omitted. This not only simplifies processing, but also avoids uneven erosion of patterned features during the BARC etch.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method of making a device, comprising:
    forming a first hard mask layer over an underlying layer;
    forming a first imprint resist layer over the first hard mask layer;
    forming first features over the first hard mask layer by bringing a first imprint template in contact with the first imprint resist layer;
    forming a first spacer layer over the first features;
    etching the first spacer layer to form a first spacer pattern and to expose top of the first features;
    removing the first features;
    patterning the first hard mask, using the first spacer pattern as a mask, to form first hard mask features;
    removing the first spacer pattern;
    forming a second imprint resist layer over the first hard mask features;
    forming second features over the first hard mask features by bringing a second imprint template in contact with the second imprint resist layer;
    forming a second spacer layer over the second features;
    etching the second spacer layer to form a second spacer pattern and to expose top of the second features;
    removing the second features;
    etching the first hard mask features, using the second spacer pattern as a mask, to form second hard mask features; and etching at least part of the underlying layer using the second hard mask features as a mask.

2. A method of claim 1, wherein:
the first features comprise a plurality of first parallel lines extending in a first direction;
the second features comprise a plurality of second parallel lines extending in a second direction, wherein the second direction differs from the first direction by 30 to 90 degrees; and
the step of etching at least part of the underlying layer forms an array of pillars.

3. A method of claim 2, wherein:
the first imprint template is the second imprint template;
the first imprint template comprises a plurality of parallel template lines;
the step of forming first features comprises bringing the first imprint template into contact with the first imprint resist layer in a first orientation to form the plurality of first parallel lines extending in the first direction; and
the step of forming second features comprises bringing the first imprint template into contact with the first imprint resist layer in a second orientation rotated by 30 to 90 degrees from the first orientation to form the plurality of second parallel lines extending in the second direction.

4. A method of claim 1, wherein the steps of forming the first and second features comprise, respectively:
UV curing the first and second imprint resist layers while in contact with the first and second imprint templates; and
removing the first and second imprint templates.

5. A method of claim 1, wherein:
the first spacer layer and the second spacer layer comprise a first material; and
the first features and the second features comprise a second material different from the first material.

6. A method of claim 1, wherein the first and second spacer layers comprise oxide spacers.

7. A method of claim 1, wherein the first hard mask layer is a silicon layer.

8. A method of claim 1, wherein the underlying layer is selected from a group consisting of a second hard mask layer, an organic hard mask layer, a device layer, or combinations thereof.

9. A method of claim 8, wherein the second hard mask layer comprises silicon oxynitride or silicon nitride.

10. A method of claim 8, wherein the organic hard mask layer comprises an amorphous carbon hard mask layer.

11. A method of claim 8, wherein:
the device layer comprises at lease one semiconductor layer; and
the step of etching the underlying layer forms an array of semiconductor pillars.

12. A method of claim 11, wherein each pillar in the array of pillars comprises a diode.

13. A method of claim 12, wherein the diode is a steering element of a memory cell and wherein the memory cell further comprises a storage element.

14. A method of claim 13, wherein the memory cell type is selected from at least one of antifuse, fuse, polysilicon memory effect cell, metal oxide memory, switchable complex metal oxide, carbon nanotube memory, graphene, amorphous or polycrystalline carbon switchable resistance material, phase change material memory, conductive bridge element, or switchable polymer memory.

15. A method of claim 13, wherein the storage element comprises a resistivity switching element.

16. A method of claim 13, wherein the memory cell is a read/write memory cell or a rewritable memory cell.

17. A method of claim 13, wherein the memory cell is located in a monolithic three dimensional array of memory cells.

18. A method of claim 2, wherein the second plurality of parallel lines are substantially free of defects corresponding to regions of overlap with the first hard mask features.

19. A method of claim 2, wherein:
the first features comprise first rails formed in the first imprint resist layer;
the second features comprise second rails formed in the second imprint resist layer; and
the first and the second rails comprise substantially vertical sidewalls.

20. A method of claim 1, wherein:
the underlying layer comprises a plurality of layers comprising a resistivity switching storage element layer and an underlying hard mask layer over the resistivity switching storage element layer; and
the step of etching at least part of the underlying layer comprises etching at least the resistivity switching storage element layer and the underlying hard mask layer, using the second hard mask features as a mask, to form first openings;
and further comprising:
filling the first openings with an insulating material;
removing the second hard mask features;
forming second openings exposing top of the resistivity switching storage element layer by removing the underlying hard mask layer; and
filling the second openings with at least one semiconductor material to form semiconductor diodes having a substantially pillar shape in the second openings.

21. The method of claim 20, wherein:
the resistivity switching storage element layer comprises a metal-insulator-metal stack; and
conductive layers of the metal-insulator-metal stack are independently selected from a group consisting of titanium or titanium nitride.

22. The method of claim 20, wherein the step of filling the second openings comprises selectively depositing the semiconductor material into the second openings.

23. The method of claim 20, wherein the step of filling the second openings comprises:
depositing the semiconductor material non-selectively over the underlying layer and into the second openings; and
planarizing the semiconductor material such that the semiconductor material remains in the second openings.

24. The method of claim 20, wherein:
each of the semiconductor diodes comprises a steering element of a memory cell; and
the memory cell further comprises a storage element comprising a portion of the etched resistivity switching storage element layer.

* * * * *